(12) United States Patent
Ishibashi

(10) Patent No.: US 12,706,526 B2
(45) Date of Patent: Aug. 11, 2026

(54) GATE DRIVING DEVICE AND POWER CONVERTER

(71) Applicant: ROHM CO., LTD., Kyoto (JP)

(72) Inventor: Takaharu Ishibashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 26 days.

(21) Appl. No.: 18/893,118

(22) Filed: Sep. 23, 2024

(65) Prior Publication Data

US 2025/0015706 A1 Jan. 9, 2025

Related U.S. Application Data

(63) Continuation of application No. PCT/JP2023/003745, filed on Feb. 6, 2023.

(30) Foreign Application Priority Data

Mar. 29, 2022 (JP) ................................. 2022-053145

(51) Int. Cl.
*H02M 1/08* (2006.01)
*H02M 1/00* (2006.01)
*H03K 17/16* (2006.01)

(52) U.S. Cl.
CPC ........... *H02M 1/08* (2013.01); *H02M 1/0054* (2021.05); *H03K 17/165* (2013.01); *H03K 2217/0063* (2013.01); *H03K 2217/0072* (2013.01)

(58) Field of Classification Search
CPC .... H02M 1/0054; H02M 1/08; H03K 17/165; H03K 2217/0063; H03K 2217/0072
(Continued)

(56) References Cited

U.S. PATENT DOCUMENTS 11,271,560 B2 3/2022 Matsubara et al.
2012/0043956 A1 2/2012 Southcombe et al.
(Continued)

FOREIGN PATENT DOCUMENTS

JP 2007215389 A 8/2007
JP 2009232529 A 10/2009
(Continued)

OTHER PUBLICATIONS

International Search Report for International Application No. PCT/JP2023/003745; mailed Mar. 7, 2023.
(Continued)

*Primary Examiner* — William Hernandez
(74) *Attorney, Agent, or Firm* — CANTOR COLBURN LLP

(57) ABSTRACT

A gate driving device comprises: a gate driving unit that outputs power for switching between on and off of a semiconductor switching element; a speed control unit that controls at least one of a turn-on speed and a turn-off speed of the semiconductor switching element; and a speed switching unit that switches at least one of the turn-on speed and the turn-off speed in response to an instruction from the speed control unit. The speed switching unit includes: a plurality of impedance elements (gate resistors, for example); and switches that control power output from the gate driving unit and to pass through corresponding ones of the plurality of impedance elements. The speed control unit controls the switches on the basis of an output current flowing in the semiconductor switching element.

10 Claims, 28 Drawing Sheets

(58) Field of Classification Search
USPC .......................................... 327/108, 109, 110
See application file for complete search history.

(56) References Cited

U.S. PATENT DOCUMENTS

| | | | | |
|---|---|---|---|---|
| 2013/0229209 | A1* | 9/2013 | Miyauchi | H03K 17/56 327/109 |
| 2021/0184670 | A1 | 6/2021 | Matsubara et al. | |

FOREIGN PATENT DOCUMENTS

| | | | |
|---|---|---|---|
| JP | 2011166920 | A | 8/2011 |
| JP | 2014103485 | A | 6/2014 |
| JP | 2016152532 | A | 8/2016 |
| JP | 2017142163 | A | 8/2017 |
| JP | 2020113825 | A | 7/2020 |
| WO | 2020144883 | A1 | 7/2020 |

OTHER PUBLICATIONS

PCT Written Opinion of the International Searching Authority for International Application No. PCT/JP2023/003745; mailed Mar. 7, 2023.

* cited by examiner

GATE DRIVING DEVICE AND POWER CONVERTER

CROSS-REFERENCE TO RELATED APPLICATIONS

This nonprovisional application is a continuation application of International Patent Application No. PCT/JP2023/003745 filed on Feb. 6, 2023, which claims priority Japanese Patent Application No. 2022-053145 filed on Mar. 29, 2022, the entire contents of which are hereby incorporated by reference.

TECHNICAL FIELD

The present disclosure relates to a gate driving device and a power converter using the gate driving device.

BACKGROUND

A power converter such as an inverter is mounted with a gate driving device as means for driving a semiconductor switching element.

Patent Document 1 can be cited as an example of a conventional technique relating to the above.

PRIOR ART DOCUMENT

Patent Document

Patent Document 1: Japanese Patent Application Publication No. 2011-166920

DETAILED DESCRIPTION

Comparative Example

Figure 1:
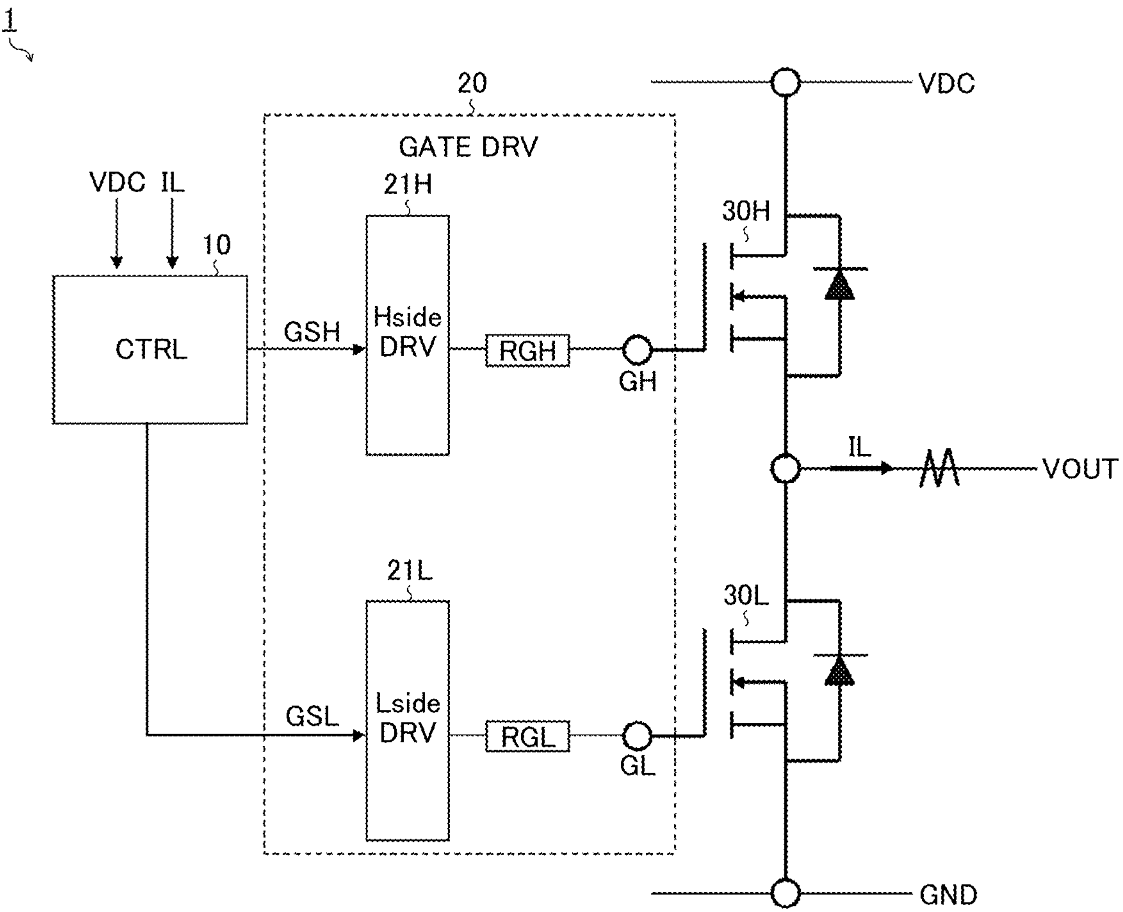
FIG. 1 is a view showing a comparative example of a power converter.

FIG. 1 is a view showing a comparative example of a power converter 1 (=a general circuit configuration to be compared with embodiments described later). The power converter 1 according to the comparative example generates a desired output voltage VOUT from a direct-current voltage VDC and supplies the output voltage VOUT to a load.

By referring to this drawing, the power converter 1 includes a control device 10, a gate driving device 20, and semiconductor switching elements 30H and 30L. The power converter 1 can be an AC/DC converter or a DC/DC converter, for example.

The control device 10 generates control signals GSH and GSL for controlling the gate driving device 20 on the basis of the direct-current voltage VDC and an output current IL. While not specifically illustrated in this drawing, the control device 10 further includes an output feedback loop for controlling the control signals GSH and GSL so as to make the output voltage VOUT become consistent with a target value.

In response to receipt of the control signals GSH and GSL output from the control device 10, the gate driving device 20 generates gate signals GH and GL for turning on and off the semiconductor switching elements 30H and 30L respectively.

By referring to this drawing, the gate driving device 20 includes an upper gate driving unit 21H for driving the semiconductor switching element 30H and a lower gate driving unit 21L for driving the semiconductor switching element 30L.

The gate driving units 21H and 21L generate the gate signals GH and GL by outputting power for switching between on and off of the semiconductor switching elements 30H and 30L in response to the control signals GSH and GSL, thereby driving the semiconductor switching elements 30H and 30L respectively.

Gate resistors RGH and RGL are connected between respective output terminals of the gate driving units 21H and 21L and respective gates of the semiconductor switching elements 30H and 30L (=respective application terminals for the gate signals GH and GL).

The semiconductor switching elements 30H and 30L are connected in series between an application terminal for the direct-current voltage VDC and an application terminal for a ground voltage GND to form a half-bridge output stage, and output the output current IL from a node of connection between the semiconductor switching elements 30H and 30L.

The semiconductor switching elements 30H and 30L are turned on and off in response to the gate signals GH and GL respectively. If both the semiconductor switching elements 30H and 30L are N-channel MOSFETs [metal oxide semiconductor field effect transistors], for example, both the semiconductor switching elements 30H and 30L are in on states if the gate signals GH and GL are at high levels, and are in off states if the gate signals GH and GL are at low levels respectively.

If both the semiconductor switching elements 30H and 30L are N-channel MOSFETs, the semiconductor switching elements 30H and 30L are accompanied by corresponding body diodes using respective drains of the semiconductor switching elements 30H and 30L as cathodes and using respective sources of the semiconductor switching elements 30H and 30L as anodes.

Examination about Switching Loss

In the power converter 1 such as an inverter, resistance values of the gate resistors RGH and RGL relating to driving of the respective semiconductor switching elements 30H and 30L are determined in consideration of a surge voltage occurring when overcurrent/overvoltage protection stops.

Meanwhile, the output current IL is smaller in a normal state when the overcurrent/overvoltage protection is not afforded than in an abnormal state when the overcurrent/overvoltage protection is afforded. Hence, the resistance values of the gate resistors RGH and RGL set by considering safety in the abnormal state cannot always be said to be proper values in the normal state. This may increase switching loss to cause risk of efficiency reduction. In particular, in a low-load range where the output current IL is small, a high ratio of switching loss might cause serious efficiency reduction.

In view of the foregoing examination, novel embodiments allowing switching loss reduction will be suggested below.

First Embodiment

Figure 2:
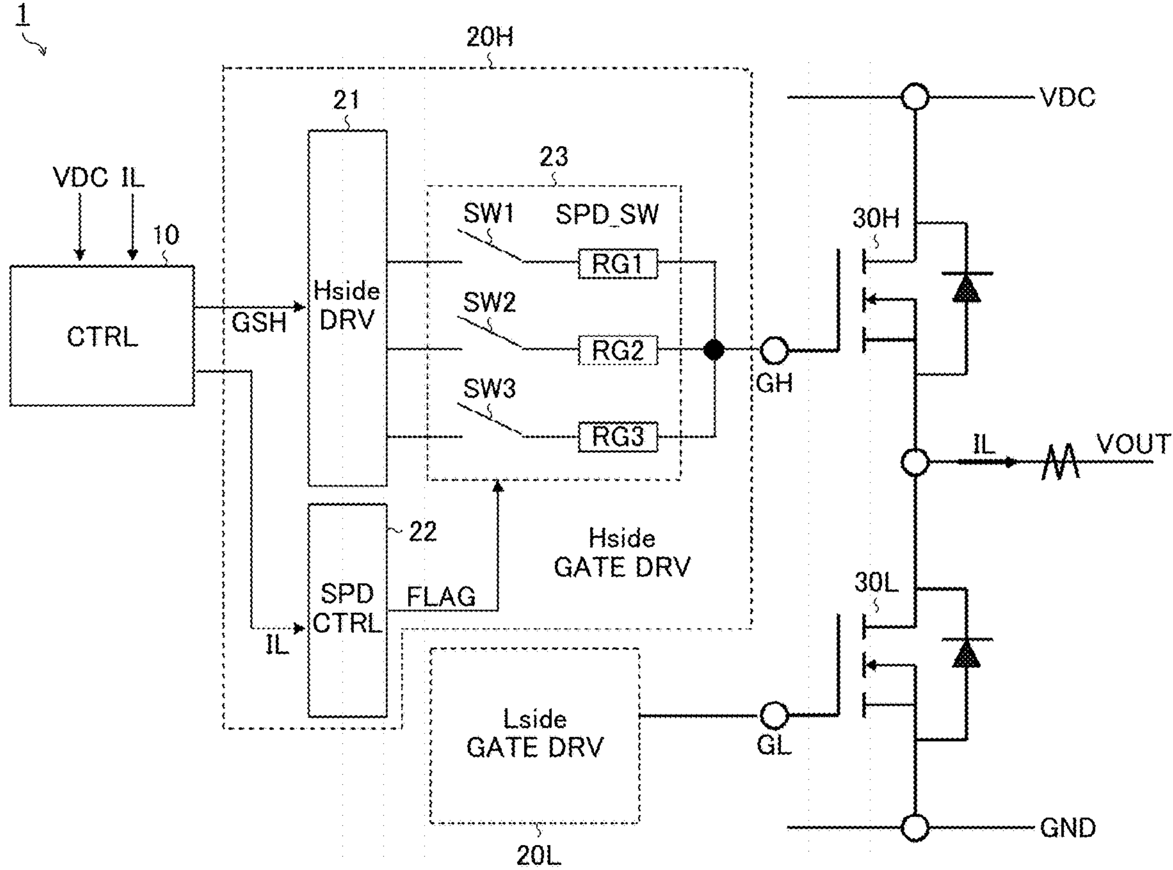
FIG. 2 is a view showing a first embodiment of the power converter.

FIG. 2 is a view showing a first embodiment of the power converter 1. The power converter 1 of the present embodiment is based on the comparative example (FIG. 1) described previously, and includes a gate driving device 20H for driving the upper semiconductor switching element 30H and a gate driving device 20L for driving the lower semiconductor switching element 30L instead of the gate driving device 20. Respective circuit configurations of the gate driving devices 20H and 20L may basically the same. Thus, in the following, the gate driving device 20H will be described in detail and description of the gate driving device 20L will be omitted.

The gate driving device 20H includes a gate driving unit 21, a speed control unit 22, and a speed switching unit 23.

The gate driving unit 21 is a circuit part corresponding to the gate driving unit 21H in FIG. 1, and outputs power for switching between on and off of the semiconductor switching element 30H in response to the control signal GSH output from the control device 10.

Specifically, during turn-on of the semiconductor switching element 30H, the gate signal GH rises from a low level to a high level to generate a charging current flowing from the gate driving unit 21 toward an input capacitance Ciss (not shown in the drawing) of the semiconductor switching element 30H.

Meanwhile, during turn-off of the semiconductor switching element 30H, the gate signal GH falls from a high level to a low level to generate a discharging current flowing from the input capacitance Ciss (not shown in the drawing) of the semiconductor switching element 30H toward the gate driving unit 21.

The speed control unit 22 generates a flag signal FLAG for controlling at least one of a turn-on speed and a turn-off speed of the semiconductor switching element 30H on the basis of information relating to the output current IL flowing in the semiconductor switching element 30H or 30L.

The speed switching unit 23 switches at least one of the turn-on speed and the turn-off speed in response to instruction (=the flag signal FLAG) from the speed control unit 22. For example, the speed switching unit 23 includes gate resistors RG1 to RG3 (=corresponding to a plurality of impedance elements), and switches SW1 to SW3 configured to control power output from the gate driving unit 21 and to pass through the gate resistors RG1 to RG3 respectively.

This will be described in detail by referring to this drawing. The gate resistors RG1 to RG3 are connected in parallel between the gate driving unit 21 and the gate of the semiconductor switching element 30H (=an application terminal for the gate signal GH). The switches SW1 to SW3 are connected in series with the gate resistors RG1 to RG3 respectively. Thus, a combined resistance value (=a gate resistance value) of the gate resistors RG1 to RG3 is switched in response to on/off states of the switches SW1 to SW3.

As an example, when the switch SW1 is on and the switches SW2 and SW3 are off, the gate resistance value is set to RG1. As another example, when the switches SW1 and SW2 are on and the switch SW3 is off, the gate resistance value is set to a combined resistance value of the gate resistors RG1 and RG2 connected in parallel. When all the switches SW1 to SW3 are on, the gate resistance value is set to a combined resistance value of the gate resistors RG1 to RG3 connected in parallel.

As the above-described gate resistance value becomes higher, the gate signal GH rises and falls more slowly. This reduces the turn-on speed and the turn-off speed of the semiconductor switching element 30H to increase switching loss. Conversely, as the above-described gate resistance value becomes lower, the gate signal GH rises and falls more steeply. This increases the turn-on speed and the turn-off speed of the semiconductor switching element 30H to reduce switching loss.

The speed control unit 22 may exert on/off control of each of the switches SW1 to SW3 on the basis of information relating to the output current IL. For example, in a low-load range where the output current IL is small, the turn-on speed and the turn-off speed of the semiconductor switching element 30H may be increased by reducing the above-described gate resistance value.

Such speed control achieves improvement of the efficiency of the power converter 1 in the low-load range where switching loss has a high ratio.

Second Embodiment

Figure 3:
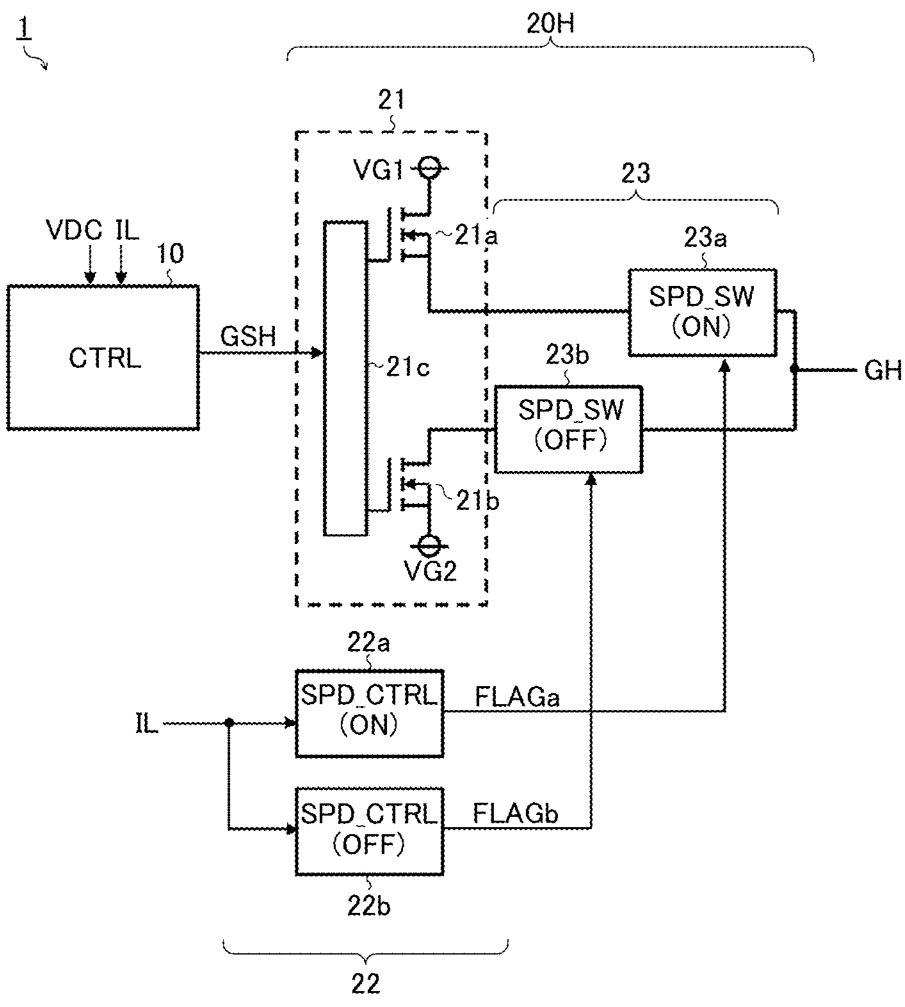
FIG. 3 is a view showing a second embodiment of the power converter.

FIG. 3 is a view showing a second embodiment of the power converter 1. The power converter 1 of the present embodiment is based on the first embodiment (FIG. 2) described previously, and has a control system for a turn-on speed and a control system for a turn-off speed provided separately.

By referring to this drawing, the gate driving unit 21 includes transistors 21*a* and 21*b* (N channel MOSFETs, for example), and a controller 21*c*.

The transistor 21*a* has a drain connected to an application terminal for a first driving voltage VG1. The transistor 21*a* has a source functioning as a first output terminal of the gate driving unit 21 and connected to the speed switching unit 23 (particularly, a speed switching unit 23*a* described later). The transistor 21*a* is in an on state during a high-level period of the gate signal GH (=an on period of the semiconductor switching element 30H), and in an off state during a low-level period of the gate signal GH (=an off period of the semiconductor switching element 30H).

The transistor 21*b* has a source connected to an application terminal for a second driving voltage VG2. The transistor 21*b* has a drain functioning as a second output terminal of the gate driving unit 21 and connected to the speed switching unit 23 (particularly, a speed switching unit 23*b* described later). The transistor 21*b* is in an on state during a low-level period of the gate signal GH (=an off period of the semiconductor switching element 30H), and in an off state during a high-level period of the gate signal GH (=an on period of the semiconductor switching element 30H).

The controller 21*c* turns on and off the transistors 21*a* and 21*b* complementarily in response to the control signal GSH output from the control device 10.

The speed control unit 22 includes speed control units 22*a* and 22*b*. The speed control unit 22*a* generates a flag signal FLAGa for controlling a turn-on speed of the semiconductor switching element 30H on the basis of information relating to the output current IL. The speed control unit 22*b* generates a flag signal FLAGb for controlling a turn-off speed of the semiconductor switching element 30H on the basis of information relating to the output current IL.

The speed switching unit 23 includes the speed switching units 23*a* and 23*b*. The speed switching unit 23*a* is connected between the source of the transistor 21*a* and the application terminal for the gate signal GH, and switches a turn-on speed of the semiconductor switching element 30H in response to the flag signal FLAGa. The speed switching unit 23*b* is connected between the drain of the transistor 21*b* and the application terminal for the gate signal GH, and switches a turn-off speed of the semiconductor switching element 30H in response to the flag signal FLAGb.

According to the present embodiment, it is possible to control a turn-on speed and a turn-off speed of the semiconductor switching element 30H separately. The present embodiment is desirably employed if there is a difference between a threshold for switching the turn-on speed and a threshold for switching the turn-off speed to be compared with the output current IL, for example.

Third Embodiment

Figure 4:
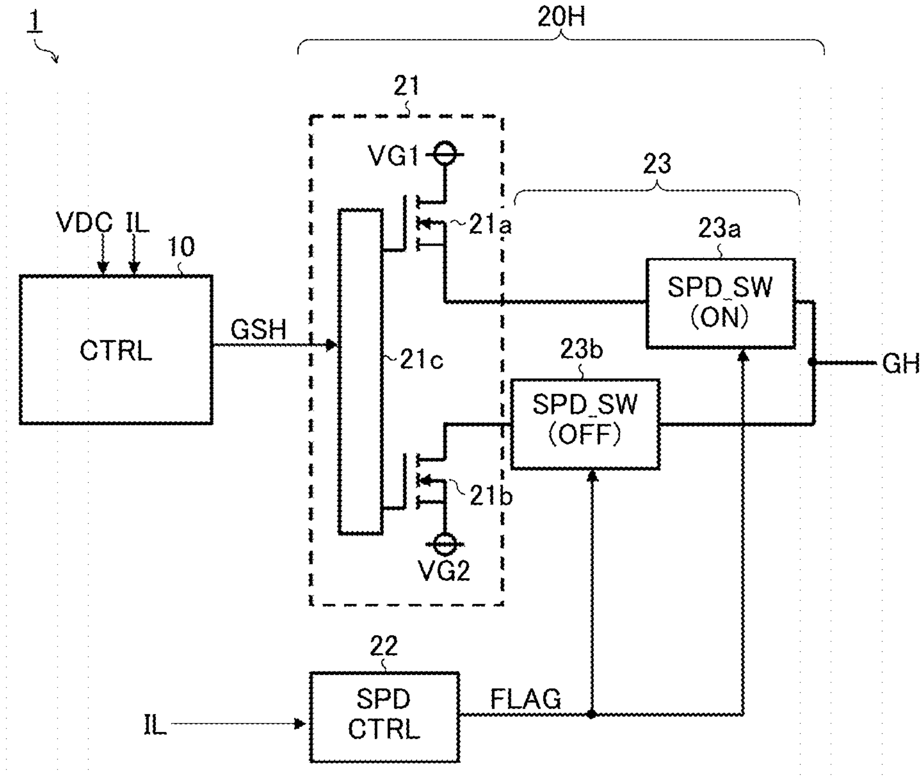
FIG. 4 is a view showing a third embodiment of the power converter.

FIG. 4 is a view showing a third embodiment of the power converter 1. While the power converter 1 of the present embodiment is based on the second embodiment (FIG. 3) described previously, the speed control units 22*a* and 22*b* are provided as a single speed control unit 22 common to turn-on and turn-off without making distinction therebetween. Specifically, the speed control unit 22 has the same configuration as that of the first embodiment (FIG. 2) previously described.

According to the present embodiment, it is possible to reduce a circuit scale by using the speed control unit 22 as a common unit. The present embodiment is desirably employed if a common value is used as a threshold for switching a turn-on speed and as a threshold for switching a turn-off speed to be compared with the output current IL, for example.

Figure 5:
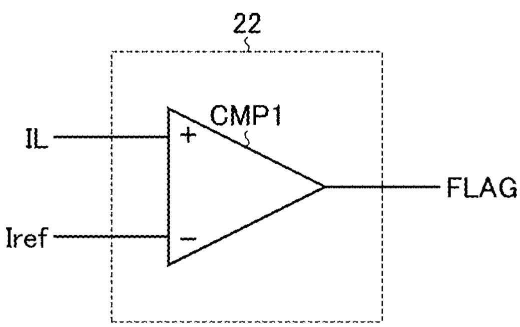
FIG. 5 is a view showing an exemplary configuration of a speed control unit.

FIG. 5 is a view showing an exemplary configuration of the speed control unit 22. The speed control unit 22 of this exemplary configuration includes a comparator CMP1.

The comparator CMP1 makes a comparison between the output current IL (or a signal containing information relating thereto) input to a non-inverting input terminal (+) and a reference current Iref (or a signal containing information relating thereto) input to an inverting input terminal (−), thereby generating the flag signal FLAG. As an example, the flag signal FLAG is at a low level if the output current IL is smaller than the reference current Iref, and at a high level if the output current IL is larger than the reference current Iref.

Figure 6:
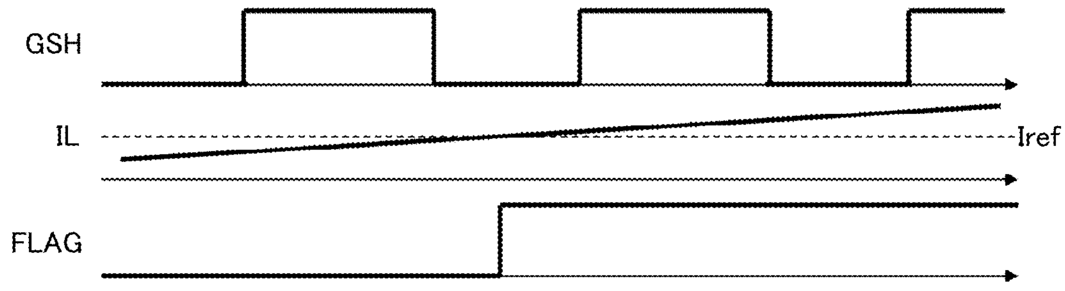
FIG. 6 is a view showing an example of speed switching control according to the third embodiment.

FIG. 6 is a view showing an example of speed switching control according to the third embodiment, and shows the control signal GSH, the output current IL, and the flag signal FLAG drawn in this order from the top.

As described previously, the flag signal FLAG is at a low level if the output current IL is smaller than the reference current Iref. In this case, the speed switching units 23*a* and 23*b* may increase a turn-on speed and a turn-off speed of the semiconductor switching element 30H by reducing a gate resistance value of each of the semiconductor switching elements 30H and 30L, for example.

Meanwhile, the flag signal FLAG is at a high level if the output current IL is larger than the reference current Iref. In this case, the speed switching units 23*a* and 23*b* may reduce a turn-on speed and a turn-off speed of the semiconductor switching element 30H by increasing a gate resistance value of each of the semiconductor switching elements 30H and 30L, for example.

Fourth Embodiment

Figure 7:
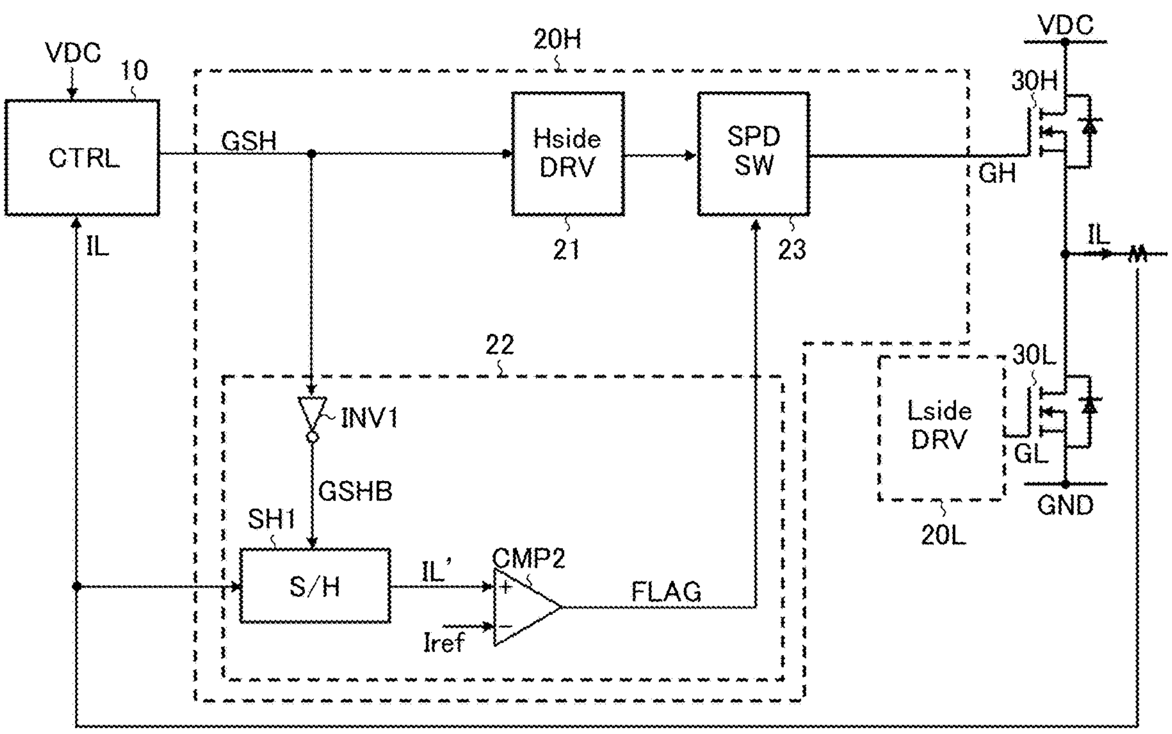
FIG. 7 is a view showing a fourth embodiment of the power converter.

FIG. 7 is a view showing a fourth embodiment of the power converter 1. While the power converter 1 of the present embodiment is based on the first embodiment (FIG. 2) described previously, the speed control unit 22 has an exemplary internal configuration described in detail.

By referring to this drawing, the speed control unit 22 includes an inverter INV1, a sample hold circuit SH1, and a comparator CMP2.

The inverter INV1 inverts a logic level of the control signal GSH to generate an inverted control signal GSHB. Thus, the inverted control signal GSHB is at a low level if the control signal GSH is at a high level, and at a high level if the control signal GSH is at a low level.

In synchronization with the inverted control signal GSHB, the sample hold circuit SH1 holds a detection value of the output current IL for a fixed period, thereby outputting a held output current IL' (or a signal containing information relating thereto).

The comparator CMP2 makes a comparison between the held output current IL' (or a signal containing information relating thereto) input to a non-inverting input terminal (+) and the reference current Iref (or a signal containing information relating thereto) input to an inverting input terminal (−), thereby generating the flag signal FLAG. As an example, the flag signal FLAG is at a low level if the held output current IL' is smaller than the reference current Iref, and at a high level if the held output current IL' is larger than the reference current Iref.

According to the present embodiment, it is possible to prevent chattering by holding a detection value of the output current IL (=by updating the held output current IL') with timing of switching between an on state and an off state of the semiconductor switching element 30H.

Like in the second embodiment (FIG. 3) described previously, the speed control unit 22 may be divided into the two including the speed control units 22*a* and 22*b*. Likewise, the sample hold circuit SH1 may include a circuit for turn-on control and a circuit for turn-off control.

Figure 8:
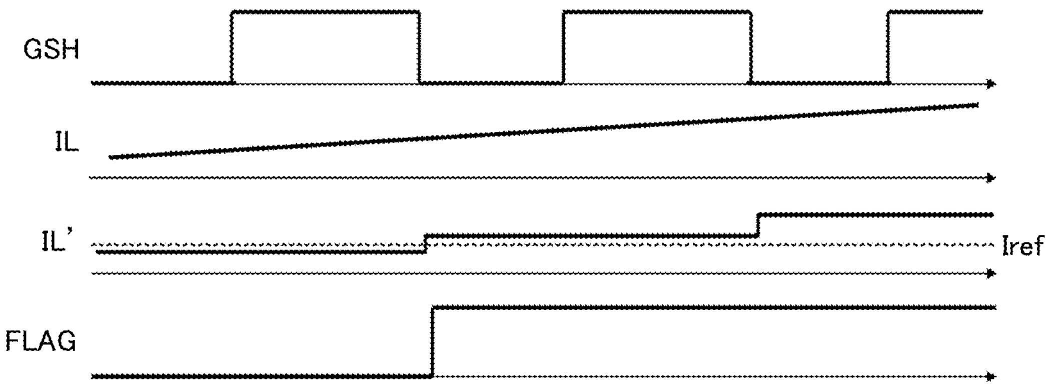
FIG. 8 is a view showing a first example of speed switching control according to the fourth embodiment.

FIG. 8 is a view showing a first example of speed switching control according to the fourth embodiment, and shows the control signal GSH, the output current IL, the held output current IL', and the flag signal FLAG drawn in this order from the top.

As shown in this drawing, the sample hold circuit SH1 may hold a detection value of the output current IL with timing of fall of the control signal GSH from a high level to a low level, specifically, with timing of switching of the semiconductor switching element 30H from an on state to an off state.

Figure 9:
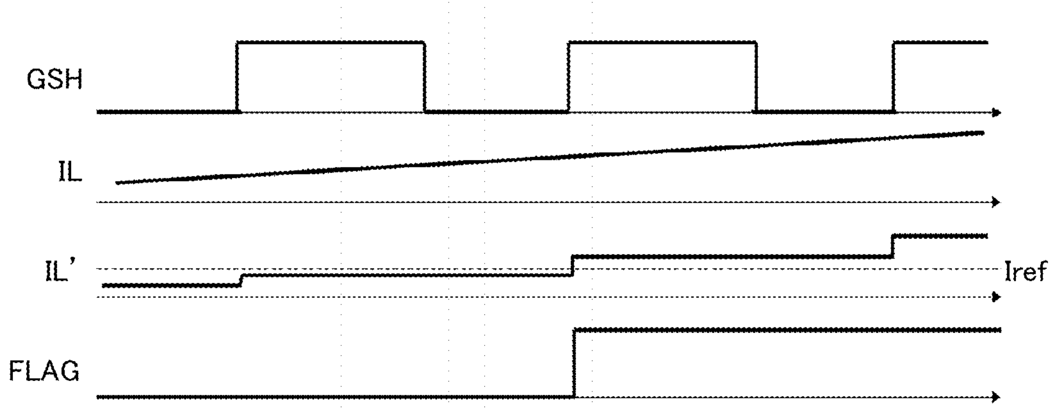
FIG. 9 is a view showing a second example of the speed switching control according to the fourth embodiment.

FIG. 9 is a view showing a second example of the speed switching control according to the fourth embodiment, and shows the control signal GSH, the output current IL, the held output current IL', and the flag signal FLAG drawn in this order from the top like FIG. 8 referred to previously.

As shown in this drawing, the sample hold circuit SH1 may hold a detection value of the output current IL with timing of rise of the control signal GSH from a low level to a high level, specifically, with timing of switching of the semiconductor switching element 30H from an off state to an on state.

Fifth Embodiment

Figure 10:
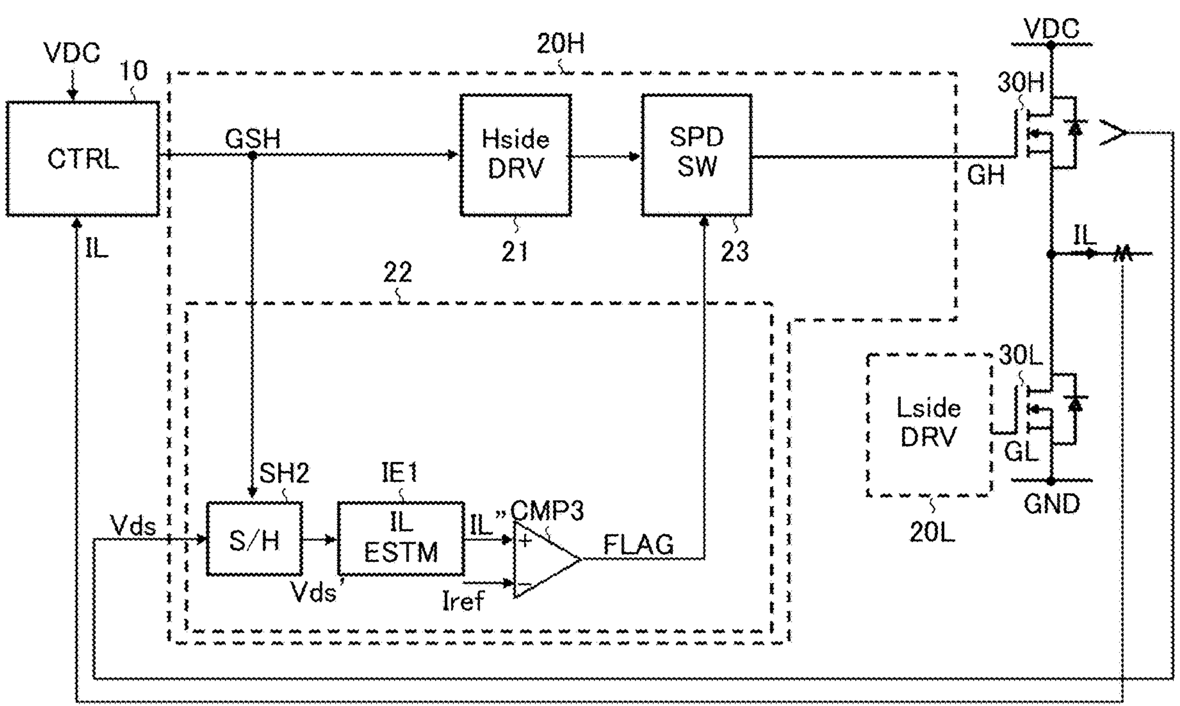
FIG. 10 is a view showing a fifth embodiment of the power converter.

FIG. 10 is a view showing a fifth embodiment of the power converter 1. While the power converter 1 of the present embodiment is based on the fourth embodiment (FIG. 7) described previously, change is made to the internal configuration of the speed control unit 22.

By referring to this drawing, the speed control unit 22 includes a sample hold circuit SH2, a current estimation part IE1, and a comparator CMP3.

In synchronization with the control signal GSH, the sample hold circuit SH2 holds a drain-source voltage Vds for a fixed period in an on period of the semiconductor switching element 30H, thereby outputting a held drain-source voltage Vds'.

If each of a turn-on speed and a turn-off speed is switched between a small number of steps, a desaturation detection signal (a so-called DESAT signal) of the semiconductor switching element 30H may be input to the sample hold circuit SH2 instead of the drain-source voltage Vds in the semiconductor switching element 30H.

The current estimation part IE1 derives an estimate value IL" of the output current IL from the held drain-source voltage Vds'. The current estimation part IE1 may have an approximate expression $IL=k1\times Vds+k2$ (where k1 and k2 are constants) showing current-voltage characteristics in the semiconductor switching element 30H, for example.

The comparator CMP3 makes a comparison between the estimate value IL" (or a signal containing information relating thereto) of the output current IL input to a non-inverting input terminal (+) from the current estimation part IE1 and the reference current Iref (or a signal containing information relating thereto) input to an inverting input terminal (−), thereby generating the flag signal FLAG. As an example, the flag signal FLAG is at a low level if the estimate value IL" of the output current IL is smaller than the reference current Iref, and at a high level if the estimate value IL" of the output current IL is larger than the reference current Iref.

Figure 11:
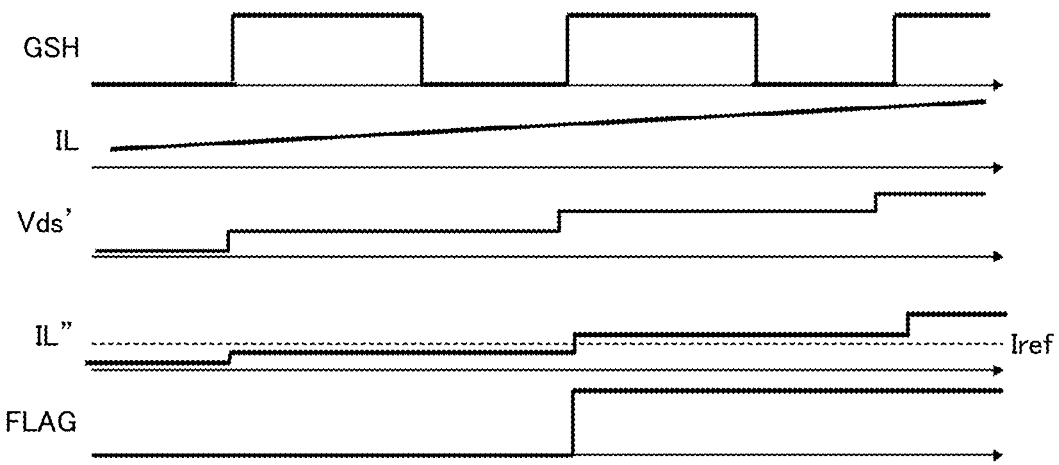
FIG. 11 is a view showing an example of speed switching control according to the fifth embodiment.

FIG. 11 is a view showing an example of speed switching control according to the fifth embodiment, and shows the control signal GSH, the output current IL, the held drain-source voltage Vds', the estimate value IL" of the output current IL, and the flag signal FLAG drawn in this order from the top.

As shown in this drawing, the sample hold circuit SH2 may be configured to hold the drain-source voltage Vds in the semiconductor switching element 30H (=to update the held drain-source voltage Vds') with timing of rise of the control signal GSH from a low level to a high level, specifically, with timing of switching of the semiconductor switching element 30H from an off state to an on state.

Sixth Embodiment

Figure 12:
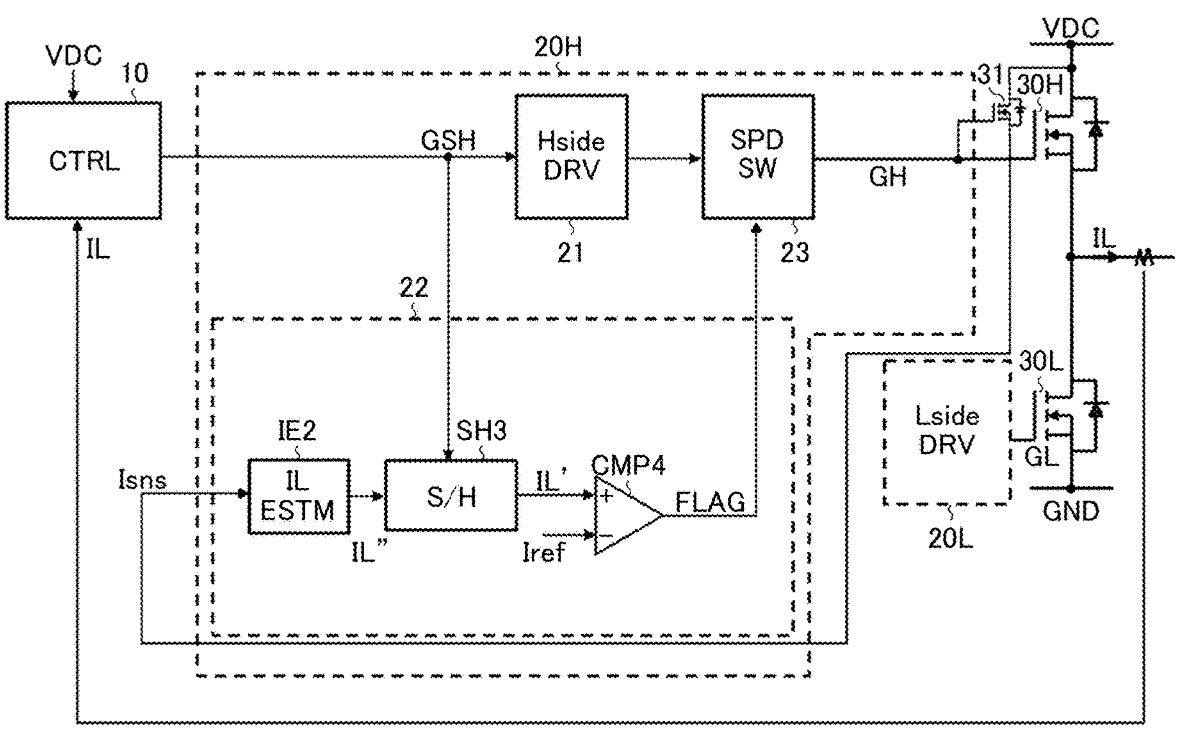
FIG. 12 is a view showing a sixth embodiment of the power converter.

FIG. 12 is a view showing a sixth embodiment of the power converter 1. While the power converter 1 of the present embodiment is based on the fourth embodiment (FIG. 7) described previously, a sense transistor 31 is provided as means of detecting the output current IL.

The sense transistor 31 has a gate and a drain connected to the gate and the drain of the semiconductor switching element 30H respectively. A sense current Isns responsive to the output current IL flows in the sense transistor 31 connected in this way. The sense transistor 31 may be modularized together with the semiconductor switching element 30H.

In response to introduction of the sense transistor 31, change is also made to the internal configuration of the speed control unit 22. By referring to this drawing, the speed control unit 22 includes a current estimation part IE2, a sample hold circuit SH3, and a comparator CMP4.

The current estimation part IE2 derives the estimate value IL" of the output current IL from the sense current Isns flowing in the sense transistor 31. The current estimation part IE2 may have an approximate expression $IL=k3\times Isns$ (where k3 is a constant) showing a ratio between the output current IL and the sense current Isns, for example.

In synchronization with the control signal GSH, the sample hold circuit SH3 holds the estimate value IL" of the output current IL for a fixed period in an on period of the semiconductor switching element 30H, thereby outputting the held output current IL' (or a signal containing information relating thereto).

The comparator CMP4 makes a comparison between the held output current IL' (or a signal containing information relating thereto) input to a non-inverting input terminal (+) and the reference current Iref (or a signal containing information relating thereto) input to an inverting input terminal (−), thereby generating the flag signal FLAG. As an example, the flag signal FLAG is at a low level if the held output current IL' is smaller than the reference current Iref, and at a high level if the held output current IL' is larger than the reference current Iref.

Figure 13:
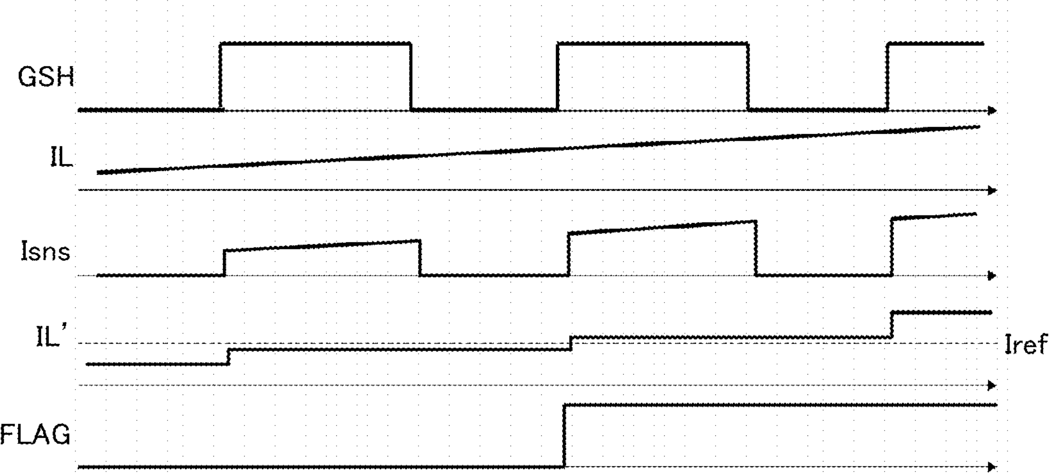
FIG. 13 is a view showing an example of speed switching control according to the sixth embodiment.

FIG. 13 is a view showing an example of speed switching control according to the sixth embodiment, and shows the control signal GSH, the output current IL, the sense current Isns, the held output current IL', and the flag signal FLAG drawn in this order from the top.

As shown in this drawing, the sample hold circuit SH3 may hold the sense current Isns (eventually, the estimate value IL" of the output current IL) with timing of rise of the control signal GSH from a low level to a high level, specifically, with timing of switching of the semiconductor switching element 30H from an off state to an on state.

Seventh Embodiment

Figure 14:
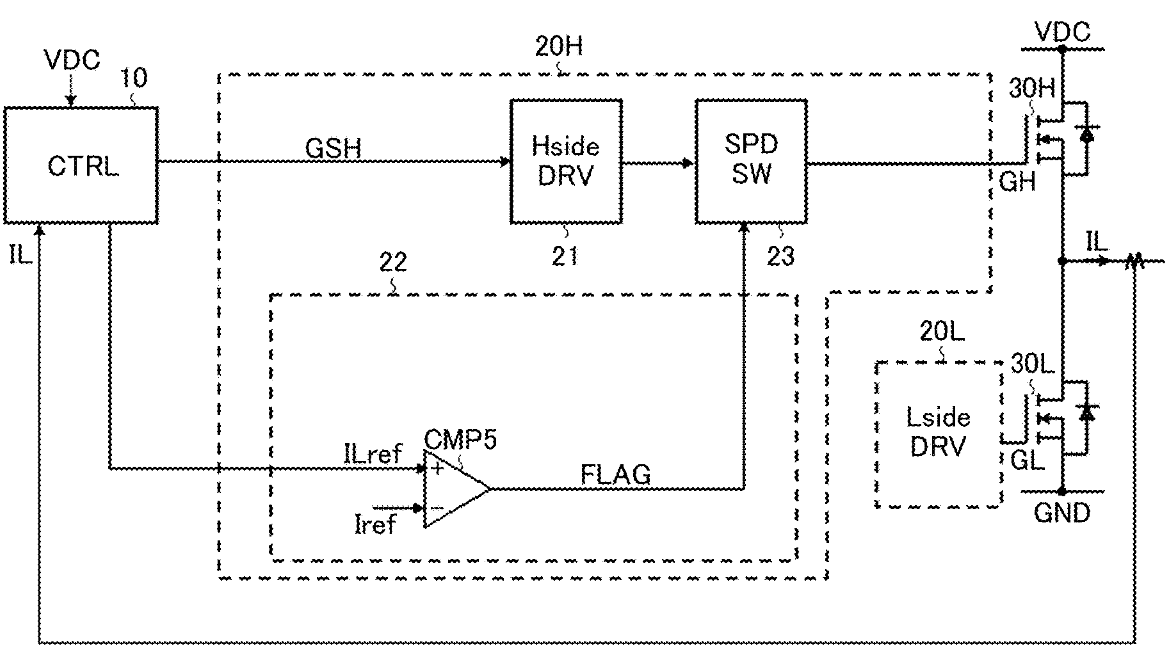
FIG. 14 is a view showing a seventh embodiment of the power converter.

FIG. 14 is a view showing a seventh embodiment of the power converter 1. While the power converter 1 of the present embodiment is based on the fourth embodiment (FIG. 7) described previously, change is made to the internal configuration of the speed control unit 22.

By referring to this drawing, the speed control unit 22 includes a comparator CMP5, and controls the speed switching unit 23 (more specifically, a switch belonging to the speed switching unit 23) in response to acceptance of a current command value ILref generated by the control device 10.

The comparator CMP5 makes a comparison between the current command value ILref input to a non-inverting input terminal (+) and the reference current Iref (or a signal containing information relating thereto) input to an inverting input terminal (−), thereby generating the flag signal FLAG. As an example, the flag signal FLAG is at a low level if the current command value ILref is smaller than the reference current Iref, and at a high level if the current command value ILref is larger than the reference current Iref.

The above-described current command value ILref is one type of internal signal generated by the control device 10 in each switching cycle of the semiconductor switching element 30H, and is inherently used for internal processing (such as current mode control) by the control device 10.

Unlike in the fourth to sixth embodiments described previously (FIG. 7, FIG. 10, and FIG. 12), the sample hold circuits SH1 to SH3 become unnecessary in the present embodiment.

Figure 15:
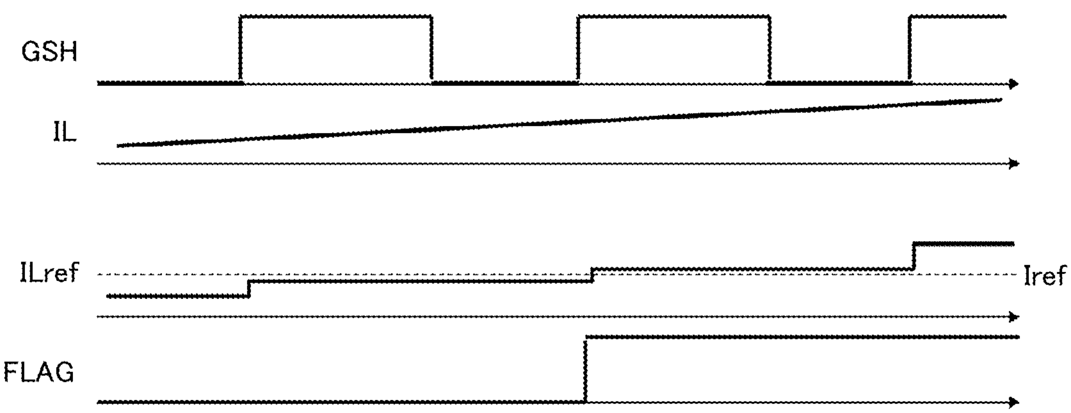
FIG. 15 is a view showing an example of speed switching control according to the seventh embodiment.

FIG. 15 is a view showing an example of speed switching control according to the seventh embodiment, and shows the control signal GSH, the output current IL, the current command value ILref, and the flag signal FLAG drawn in this order from the top.

As shown in this drawing, the control device 10 may update the current command value ILref with timing of rise of the control signal GSH from a low level to a high level, specifically, with timing of switching of the semiconductor switching element 30H from an off state to an on state.

Eighth Embodiment

Figure 16:
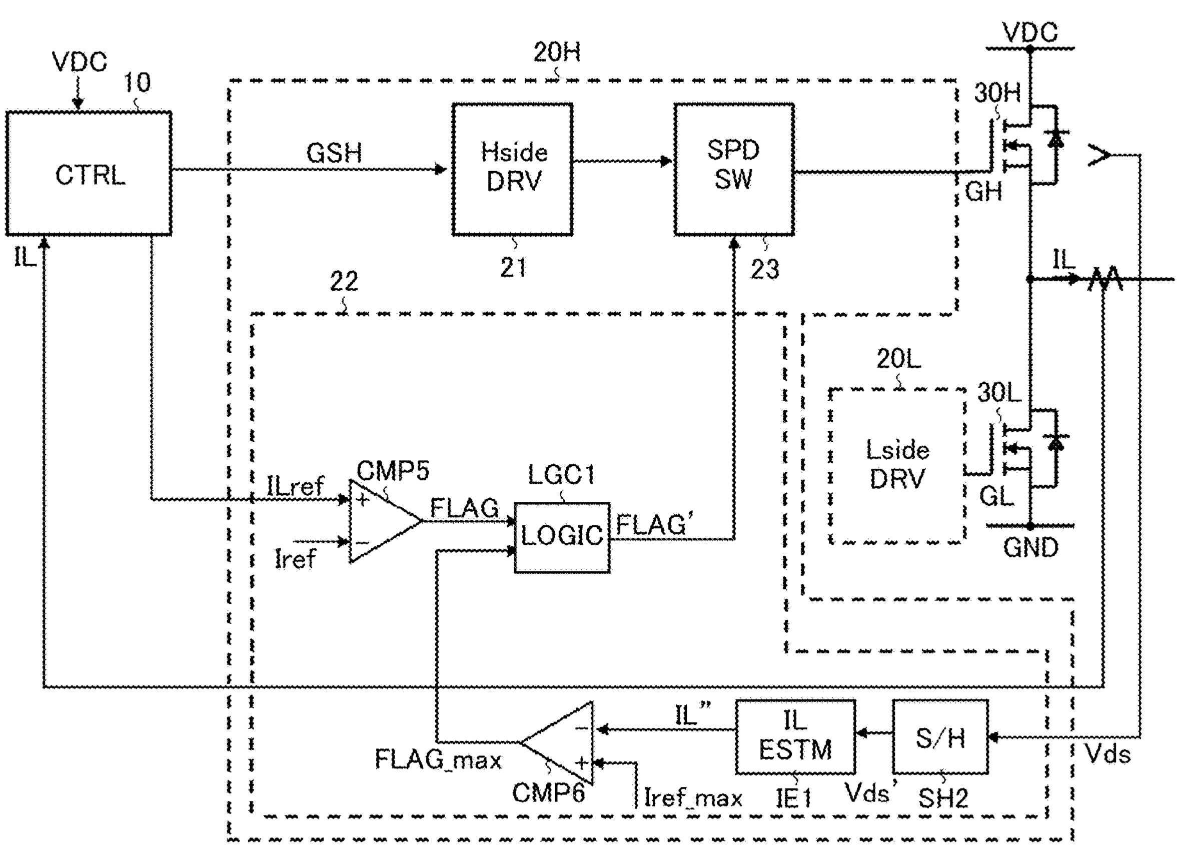
FIG. 16 is a view showing an eighth embodiment of the power converter.

FIG. 16 is a view showing an eighth embodiment of the power converter 1. While the power converter 1 of the present embodiment is configured by combining the fifth embodiment (FIG. 10) and the seventh embodiment (FIG. 14) described previously, change is made to the internal configuration of the speed control unit 22.

By referring to this drawing, the speed control unit 22 includes a comparator CMP6 and a logic LGC1 in addition to the comparator CMP5, the sample hold circuit SH2, and the current estimation part IE1 described previously.

The comparator CMP6 makes a comparison between the estimate value IL" (or a signal containing information relating thereto) of the output current IL input to an inverting input terminal (−) from the current estimation part IE1 and a maximum reference current Iref_max (or a signal containing information relating thereto) input to a non-inverting input terminal (+), thereby generating a maximum flag signal FLAG_max. As an example, the maximum flag signal FLAG_max is at a high level if the estimate value IL" of the output current IL is smaller than the maximum reference current Iref_max, and at a low level if the estimate value IL" of the output current IL is larger than the maximum reference current Iref_max.

The logic LGC1 outputs an output flag signal FLAG' in response to receipt of both the flag signal FLAG and the maximum flag signal FLAG_max. For example, if the maximum flag signal FLAG_max is at a low level, specifically, if the output current IL is larger than a predetermined threshold, the logic LGC1 may generate the output flag signal FLAG' so as to reduce at least one of a turn-on speed and a turn-off speed to a minimum independently of the flag signal FLAG responsive to the current command value ILref.

Figure 17:
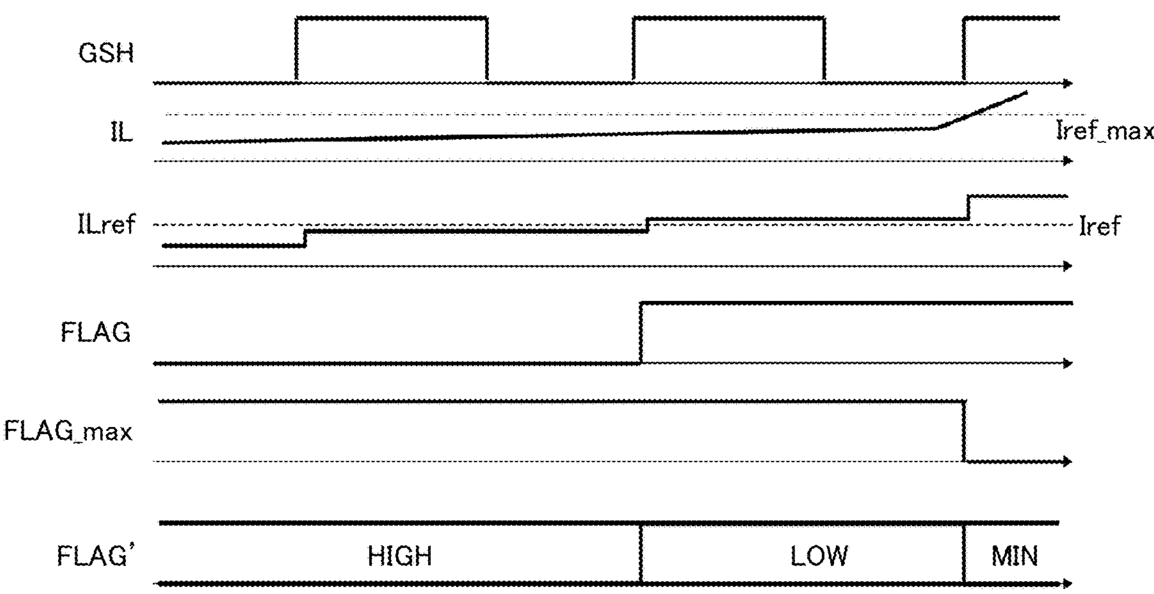
FIG. 17 is a view showing an example of speed switching control according to the eighth embodiment.

FIG. 17 is a view showing an example of speed switching control according to the eighth embodiment, and shows the control signal GSH, the output current IL, the current command value ILref, the flag signal FLAG, the maximum flag signal FLAG_max, and the output flag signal FLAG' drawn in this order from the top.

As shown in this drawing, if the maximum flag signal FLAG_max is at a high level, priority is given to the flag signal FLAG responsive to the current command value ILref. As a result, at least one of a turn-on speed and a turn-off speed becomes high (HIGH) if the flag signal FLAG is at a low level, and conversely, at least one of the turn-on speed and the turn-off speed becomes low (LOW) if the flag signal FLAG is at a high level.

Meanwhile, if the maximum flag signal FLAG_max is at a low level, at least one of the turn-on speed and the turn-off speed is reduced to a minimum (MIN) independently of the flag signal FLAG responsive to the current command value ILref, as described previously.

For example, if deviation is caused between the output current IL in an actual case and the current command value ILref generated by the control device 10 due to sudden change at a load or the like to increase the output current IL flowing in the semiconductor switching element 30H, it is possible to reduce the turn-on speed and the turn-off speed to their minimums.

Ninth Embodiment

Figure 18:
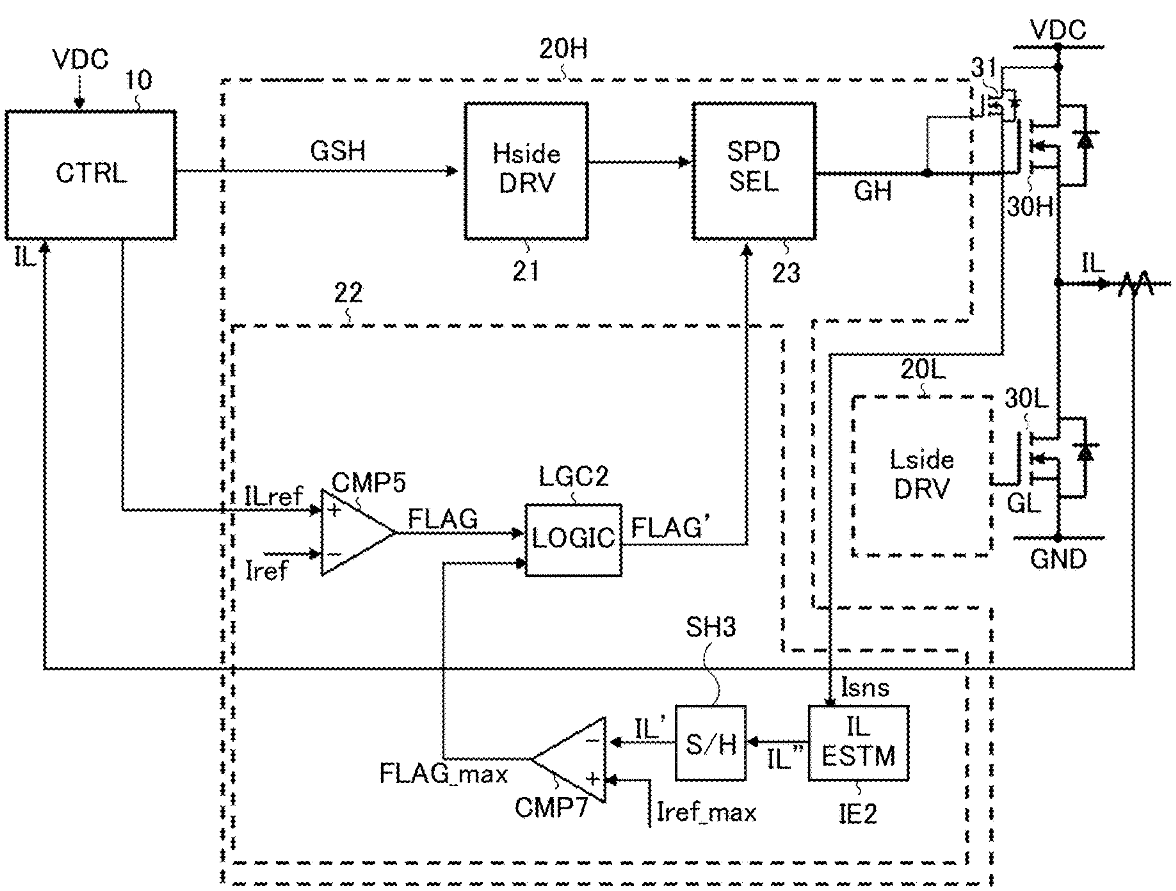
FIG. 18 is a view showing a ninth embodiment of the power converter.

FIG. 18 is a view showing a ninth embodiment of the power converter 1. While the power converter 1 of the present embodiment is configured by combining the sixth embodiment (FIG. 12) and the seventh embodiment (FIG. 14) described previously, change is made to the internal configuration of the speed control unit 22.

By referring to this drawing, the speed control unit 22 includes a comparator CMP7 and a logic LGC2 in addition to the comparator CMP5, the sample hold circuit SH3, and the current estimation part IE2 described previously.

The comparator CMP7 makes a comparison between the held output current IL' (or a signal containing information relating thereto) input to an inverting input terminal (−) from the sample hold circuit SH3 and the maximum reference current Iref_max (or a signal containing information relating thereto) input to a non-inverting input terminal (+), thereby generating the maximum flag signal FLAG_max. As an example, the maximum flag signal FLAG_max is at a high level if the held output current IL' is smaller than the maximum reference current Iref_max, and at a low level if the held output current IL' is larger than the maximum reference current Iref_max.

The logic LGC2 outputs the output flag signal FLAG' in response to receipt of both the flag signal FLAG and the maximum flag signal FLAG_max. For example, if the maximum flag signal FLAG_max is at a low level, specifically, if the output current IL is larger than a predetermined threshold, the logic LGC2 may generate the output flag signal FLAG' so as to reduce at least one of a turn-on speed and a turn-off speed to a minimum independently of the flag signal FLAG responsive to the current command value ILref.

Like the eighth embodiment (FIG. 16) described previously, even if deviation is caused between the output current IL and the current command value ILref, the present embodiment still makes it possible to exert appropriate speed switching control.

Tenth Embodiment

Figure 19:
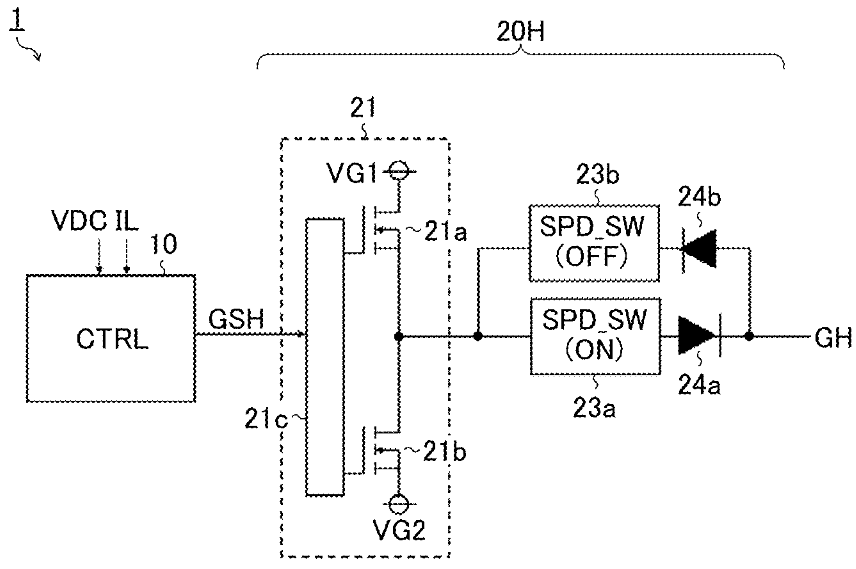
FIG. 19 is a view showing a tenth embodiment of the power converter.

FIG. 19 is a view showing a tenth embodiment of the power converter 1. While the power converter 1 of the present embodiment is based on the second embodiment (FIG. 3) or the third embodiment (FIG. 4) described previously, it additionally includes diodes 24*a* and 24*b* as constituting elements of the gate driving device 20H. In response to introduction of the diodes 24*a* and 24*b*, changes are made to the internal configuration of the gate driving unit 21 and to a connection of each of the speed switching units 23*a* and 23*b*.

By referring to this drawing, in the gate driving unit 21, the source of the transistor 21*a* and the drain of the transistor 21*b* are connected to each other, and a node of the connection therebetween is connected to respective input terminals of the speed switching units 23*a* and 23*b*.

An anode of the diode 24*a* is connected to an output terminal of the speed switching unit 23*a*. A cathode of the diode 24*b* is connected to an output terminal of the speed switching unit 23*b*. A cathode of the diode 24*a* and an anode of the diode 24*b* are both connected to the application terminal for the gate signal GH (=the gate of the semiconductor switching element 30H).

Like the second embodiment (FIG. 3) and the third embodiment (FIG. 4) described previously, the present embodiment makes it possible to control a turn-on speed and a turn-off speed of the semiconductor switching element 30H separately.

Eleventh Embodiment

Figure 20:
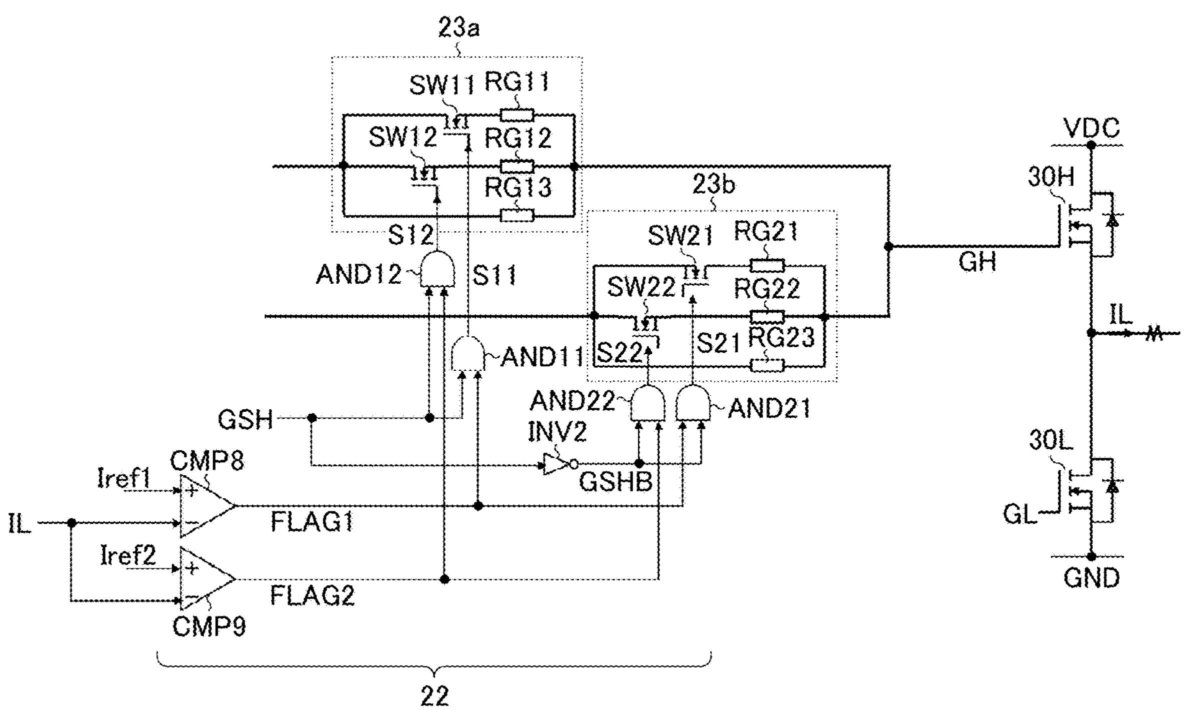
FIG. 20 is a view showing an eleventh embodiment of the power converter.

FIG. 20 is a view showing an eleventh embodiment of the power converter 1. The power converter 1 of the present embodiment will be described by showing respective exemplary internal configurations of the speed control unit 22 and the speed switching units 23*a* and 23*b* in detail.

By referring to this drawing, the speed control unit 22 includes comparators CMP8 and CMP9, an inverter INV2, AND gates AND11 and AND12, and AND gates AND21 and AND 22.

The comparator CMP8 makes a comparison between the output current IL (or a signal containing information relating thereto) input to an inverting input terminal (−) and a reference current Iref1 (or a signal containing information relating thereto) input to a non-inverting input terminal (+), thereby generating a flag signal FLAG1. As an example, the flag signal FLAG1 is at a high level if the output current IL is smaller than the reference current Iref1, and at a low level if the output current IL is larger than the reference current Iref1.

The comparator CMP9 makes a comparison between the output current IL (or a signal containing information relating thereto) input to an inverting input terminal (−) and a reference current Iref2 (or a signal containing information relating thereto) input to a non-inverting input terminal (+), thereby generating a flag signal FLAG2. As an example, the flag signal FLAG2 is at a high level if the output current IL is smaller than the reference current Iref2, and at a low level if the output current IL is larger than the reference current Iref2.

The reference currents Iref1 and Iref2 may be defined as: Iref1<Iref2.

The output current IL in the speed control unit 22 is detectable by employing any of the means according to the fourth to seventh embodiments (FIG. 7, FIG. 10, FIG. 12, and FIG. 14) described previously.

The AND gate AND11 performs AND operation between the control signal GSH and the flag signal FLAG1 to generate a switching signal S11. Thus, the switching signal S11 is at a low level if at least one of the control signal GSH and the flag signal FLAG1 is at a low level, and at a high level if both the control signal GSH and the flag signal FLAG1 are at high levels.

The AND gate AND12 performs AND operation between the control signal GSH and the flag signal FLAG2 to generate a switching signal S12. Thus, the switching signal S12 is at a low level if at least one of the control signal GSH and the flag signal FLAG2 is at a low level, and at a high level if both the control signal GSH and the flag signal FLAG2 are at high levels.

The inverter INV2 inverts a logic level of the control signal GSH to generate the inverted control signal GSHB. Thus, the inverted control signal GSHB is at a low level if the control signal GSH is at a high level, and at a high level if the control signal GSH is at a low level.

The AND gate AND21 performs AND operation between the inverted control signal GSHB and the flag signal FLAG1 to generate a switching signal S21. Thus, the switching signal S21 is at a low level if at least one of the inverted control signal GSHB and the flag signal FLAG1 is at a low level, and at a high level if both the inverted control signal GSHB and the flag signal FLAG1 are at high levels.

The AND gate AND22 performs AND operation between the inverted control signal GSHB and the flag signal FLAG2 to generate a switching signal S22. Thus, the switching signal S22 is at a low level if at least one of the inverted control signal GSHB and the flag signal FLAG2 is at a low level, and at a high level if both the inverted control signal GSHB and the flag signal FLAG2 are at high levels.

The speed switching unit 23*a* includes gate resistors RG11 to RG13 (=corresponding to a plurality of impedance elements), and switches SW11 and SW12. For example, respective resistance values of the gate resistors RG11 to RG13 may be defined as: RG11≤RG12≤RG13.

Respective first terminals of the switches SW11 and SW12 and a first terminal of the gate resistor RG13 are all connected to the first output terminal of the gate driving unit 21 (=the source of the transistor 21*a* in FIG. 3 described previously). A second terminal of the switch SW11 is connected to a first terminal of the gate resistor RG11. A second terminal of the switch SW12 is connected to a first terminal of the gate resistor RG12. Respective second terminals of the gate resistors RG11 to RG13 are all connected to the application terminal for the gate signal GH (=the gate of the semiconductor switching element 30H).

The switch SW11 is turned on and off in response to the switching signal S11. If an N-channel MOSFET is employed as the switch SW11, for example, the switch SW11 is in an on state if the switching signal S11 is at a high level, and in an off state if the switching signal S11 is at a low level.

The switch SW12 is turned on and off in response to the switching signal S12. If an N-channel MOSFET is employed as the switch SW12, for example, the switch SW12 is in an on state if the switching signal S12 is at a high level, and in an off state if the switching signal S12 is at a low level.

The speed switching unit 23*a* of this exemplary configuration controls the switches SW11 and SW12 to switch the number of parallel connections of the gate resistors RG11 to RG13, thereby switching a gate resistance value (=a combined resistance value of the gate resistors RG11 to RG13) to contribute to a turn-on speed of the semiconductor switching element 30H.

The speed switching unit 23*b* includes gate resistors RG21 to RG23 (=corresponding to a plurality of impedance elements), and switches SW21 and SW22. For example, respective resistance values of the gate resistors RG21 to RG23 may be defined as: RG21≤RG22≤RG23.

Respective first terminals of the switches SW21 and SW22 and a first terminal of the gate resistor RG23 are all connected to the second output terminal of the gate driving unit 21 (=the drain of the transistor 21*b* in FIG. 3 described previously). A second terminal of the switch SW21 is connected to a first terminal of the gate resistor RG21. A second terminal of the switch SW22 is connected to a first terminal of the gate resistor RG22. Respective second terminals of the gate resistors RG21 to RG23 are all connected to the application terminal for the gate signal GH (=the gate of the semiconductor switching element 30H).

The switch SW21 is turned on and off in response to the switching signal S21. If an N-channel MOSFET is employed as the switch SW21, for example, the switch SW21 is in an on state if the switching signal S21 is at a high level, and in an off state if the switching signal S21 is at a low level.

The switch SW22 is turned on and off in response to the switching signal S22. If an N-channel MOSFET is employed as the switch SW22, for example, the switch SW22 is in an on state if the switching signal S22 is at a high level, and in an off state if the switching signal S22 is at a low level.

The speed switching unit 23*b* of this exemplary configuration controls the switches SW21 and SW22 to switch the number of parallel connections of the gate resistors RG21 to RG23, thereby switching a gate resistance value (=a combined resistance value of the gate resistors RG21 to RG23) to contribute to a turn-off speed of the semiconductor switching element 30H.

Figure 21:
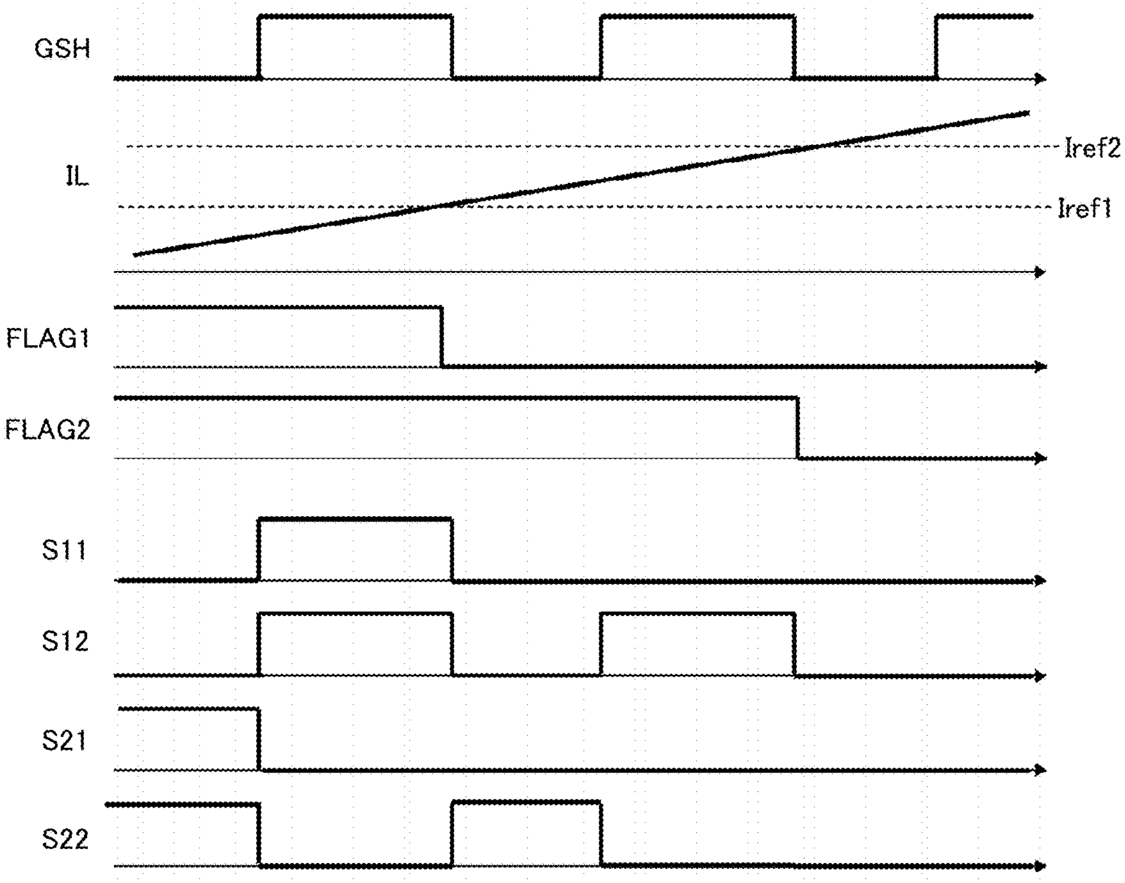
FIG. 21 is a view showing an example of speed switching control according to the eleventh embodiment.

FIG. 21 is a view showing an example of speed switching control according to the eleventh embodiment, and shows the control signal GSH, the output current IL, the flag signals FLAG1 and FLAG2, the switching signals S11 and S12, and the switching signals S21 and S22 drawn in this order from the top.

Described first is a case where IL<Iref1. In this case, both the flag signals FLAG1 and FLAG2 are at high levels.

Thus, during a high-level period of the control signal GSH (=corresponding to an on period of the semiconductor switching element 30H), both the switching signals S11 and S12 are at high levels. As a result, both the switches SW11 and SW12 are put into on states, so that a gate resistance value (=a combined resistance value) of the speed switching unit 23*a* is set to a combined resistance value of the gate resistors RG11 to RG13 connected in parallel. This state corresponds to a state where the gate resistance value of the speed switching unit 23*a* is smallest, in other words, a state where a turn-on speed of the semiconductor switching element 30H is highest. During the high-level period of the control signal GSH, both the switching signals S21 and S22 are at low levels to put both the switches SW21 and SW22 into off states.

During a low-level period of the control signal GSH (=corresponding to an off period of the semiconductor switching element 30H), both the switching signals S21 and S22 are at high levels. As a result, both the switches SW21 and SW22 are put into on states, so that a gate resistance value (=a combined resistance value) of the speed switching unit 23*b* is set to a combined resistance value of the gate resistors RG21 to RG23 connected in parallel. This state corresponds to a state where the gate resistance value of the speed switching unit 23*b* is smallest, in other words, a state where a turn-off speed of the semiconductor switching element 30H is highest. During the low-level period of the control signal GSH, both the switching signals S11 and S12 are at low levels to put both the switches SW11 and SW12 into off states.

Described next is a case where Iref1<IL<Iref2. In this case, the flag signal FLAG1 is at a low level and the flag signal FLAG2 is at a high level.

Thus, during a high-level period of the control signal GSH (=corresponding to an on period of the semiconductor switching element 30H), the switching signal S11 is at a low level and the switching signal S12 is at a high level. As a result, the switch SW11 is put into an off state and the switch SW12 is put into an on state, so that a gate resistance value (=a combined resistance value) of the speed switching unit 23*a* is set to a combined resistance value of the gate resistors RG12 and RG13 connected in parallel. This state corresponds to a state where the gate resistance value of the speed switching unit 23*a* is increased by one step, in other words, a state where a turn-on speed of the semiconductor switching element 30H is reduced by one step. As has also been described previously, during the high-level period of the control signal GSH, both the switching signals S21 and S22 are at low levels to put both the switches SW21 and SW22 into off states.

During a low-level period of the control signal GSH (=corresponding to an off period of the semiconductor switching element 30H), the switching signal S21 is at a low level and the switching signal S22 is at a high level. As a result, the switch SW21 is put into an off state and the switch SW22 is put into an on state, so that a gate resistance value (=a combined resistance value) of the speed switching unit 23*b* is set to a combined resistance value of the gate resistors RG22 and RG23 connected in parallel. This state corresponds to a state where the gate resistance value of the speed switching unit 23*b* is increased by one step, in other words, a state where a turn-off speed of the semiconductor switching element 30H is reduced by one step. As has also been described previously, during the low-level period of the control signal GSH, both the switching signals S11 and S12 are at low levels to put both the switches SW11 and SW12 into off states.

Described next is a case where Iref2<IL. In this case, both the flag signals FLAG1 and FLAG2 are at low levels.

Thus, during a high-level period of the control signal GSH (=corresponding to an on period of the semiconductor switching element 30H), both the switching signals S11 and S12 are at low levels. As a result, both the switches SW11 and SW12 are put into off states, so that a gate resistance value (=a combined resistance value) of the speed switching unit 23*a* is set to RG13. This state corresponds to a state where the gate resistance value of the speed switching unit 23*a* is largest, in other words, a state where a turn-on speed of the semiconductor switching element 30H is lowest. As has also been described previously, during the high-level period of the control signal GSH, both the switching signals S21 and S22 are at low levels to put both the switches SW21 and SW22 into off states.

During a low-level period of the control signal GSH (=corresponding to an off period of the semiconductor switching element 30H), both the switching signals S21 and S22 are at low levels. As a result, both the switches SW21 and SW22 are put into off states, so that a gate resistance value (=a combined resistance value) of the speed switching unit 23*b* is set to RG23. This state corresponds to a state where the gate resistance value of the speed switching unit 23*b* is largest, in other words, a state where a turn-off speed of the semiconductor switching element 30H is lowest. As has also been described previously, during the low-level period of the control signal GSH, both the switching signals S11 and S12 are at low levels to put both the switches SW11 and SW12 into off states.

Twelfth Embodiment

Figure 22:
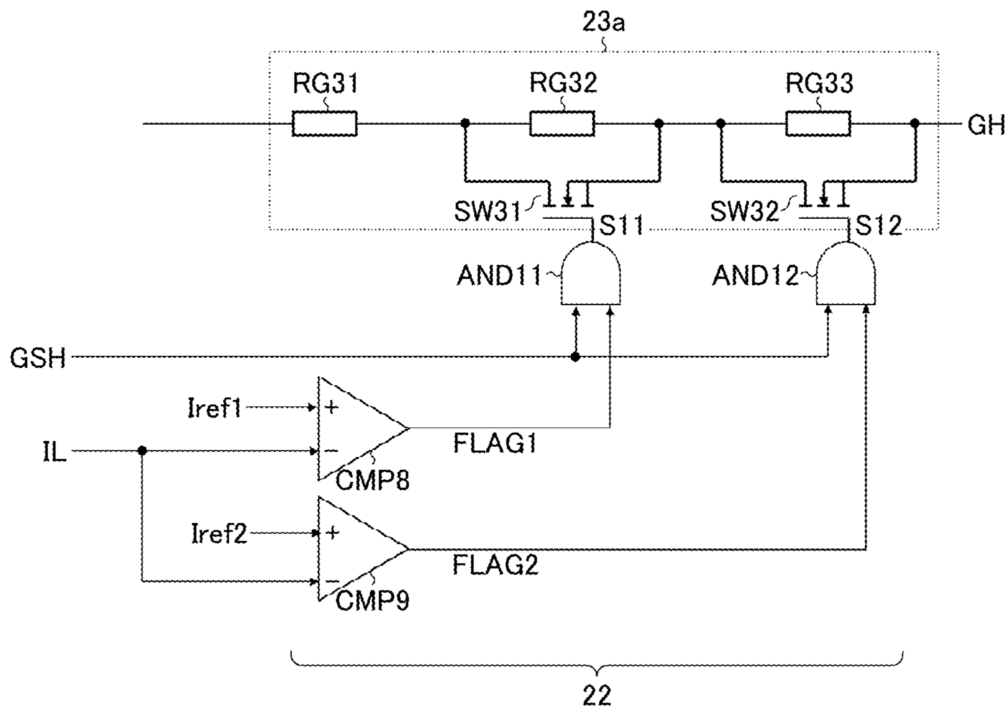
FIG. 22 is a view showing a twelfth embodiment of the power converter.

FIG. 22 is a view showing a twelfth embodiment of the power converter 1. While the power converter 1 of the present embodiment is based on the eleventh embodiment (FIG. 20) described previously, change is made to the internal configuration of the speed switching unit 23*a*. While the speed switching unit 23*b* is not drawn explicitly in this drawing, a circuit configuration of the speed switching unit 23*b* can basically be the same as that of the speed switching unit 23*a*. Thus, in the following, the speed switching unit 23*a* will be described in detail and description of the speed switching unit 23*b* will be omitted.

The speed switching unit 23*a* includes gate resistors RG31 to RG33 (=corresponding to a plurality of impedance elements), and switches SW31 and SW32. For example, respective resistance values of the gate resistors RG31 to RG33 may be defined as: RG31≤RG32≤RG33.

A first terminal of the gate resistor RG31 is connected to the first output terminal of the gate driving unit 21 (=the source of the transistor 21*a* in FIG. 3 described previously). A second terminal of the gate resistor RG31 is connected to respective first terminals of the gate resistor RG32 and the switch SW31. Respective second terminals of the gate resistor RG32 and the switch SW31 are both connected to respective first terminals of the gate resistor RG33 and the switch SW32. Respective second terminals of the gate resistor RG33 and the switch SW32 are both connected to the application terminal for the gate signal GH (=the gate of the semiconductor switching element 30H).

The switch SW31 is turned on and off in response to the switching signal S11. If an N-channel MOSFET is employed as the switch SW31, for example, the switch SW31 is in an on state if the switching signal S11 is at a high level, and in an off state if the switching signal S11 is at a low level.

The switch SW32 is turned on and off in response to the switching signal S12. If an N-channel MOSFET is employed as the switch SW32, for example, the switch SW32 is in an on state if the switching signal S12 is at a high level, and in an off state if the switching signal S12 is at a low level.

The speed switching unit 23*a* of this exemplary configuration controls the switches SW31 and SW32 to switch the number of series connections of the gate resistors RG31 to RG33, thereby switching a gate resistance value (=a combined resistance value of the gate resistors RG31 to RG33) to contribute to a turn-on speed of the semiconductor switching element 30H.

Figure 23:
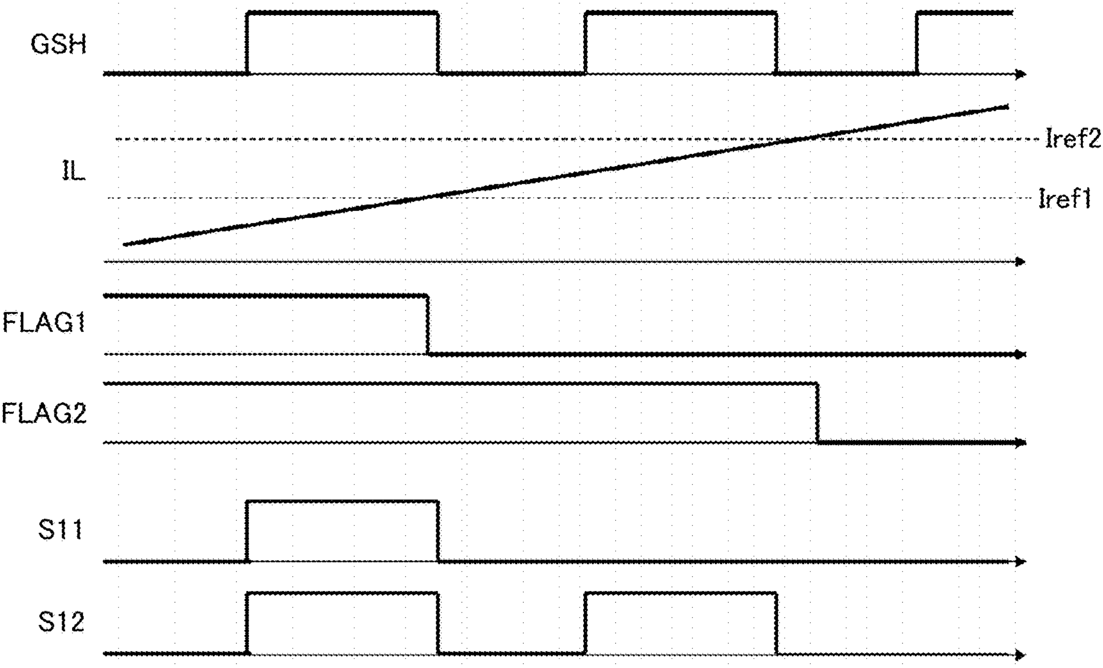
FIG. 23 is a view showing an example of speed switching control according to the twelfth embodiment.

FIG. 23 is a view showing an example of speed switching control according to the twelfth embodiment, and shows the control signal GSH, the output current IL, the flag signals FLAG1 and FLAG2, and the switching signals S11 and S12 drawn in this order from the top. Described first is a case where IL<Iref1. In this case, both the flag signals FLAG1 and FLAG2 are at high levels.

Thus, during a high-level period of the control signal GSH (=corresponding to an on period of the semiconductor switching element 30H), both the switching signals S11 and S12 are at high levels. As a result, both the switches SW31 and SW32 are put into on states, so that a gate resistance value (=a combined resistance value) of the speed switching unit 23*a* is set to RG31. This state corresponds to a state where the gate resistance value of the speed switching unit 23*a* is smallest, in other words, a state where a turn-on speed of the semiconductor switching element 30H is highest.

Described next is a case where Iref1<IL<Iref2. In this case, the flag signal FLAG1 is at a low level and the flag signal FLAG2 is at a high level.

Thus, during a high-level period of the control signal GSH (=corresponding to an on period of the semiconductor switching element 30H), the switching signal S11 is at a low level and the switching signal S12 is at a high level. As a result, the switch SW31 is put into an off state and the switch SW32 is put into an on state, so that a gate resistance value (=a combined resistance value) of the speed switching unit 23*a* is set to RG31+RG32. This state corresponds to a state where the gate resistance value of the speed switching unit 23*a* is increased by one step, in other words, a state where a turn-on speed of the semiconductor switching element 30H is reduced by one step.

Described next is a case where Iref2<IL. In this case, both the flag signals FLAG1 and FLAG2 are at low levels.

Thus, during a high-level period of the control signal GSH (=corresponding to an on period of the semiconductor switching element 30H), both the switching signals S11 and S12 are at low levels. As a result, both the switches SW31 and SW32 are put into off states, so that a gate resistance value (=a combined resistance value) of the speed switching unit 23*a* is set to RG31+RG32+RG33. This state corresponds to a state where the gate resistance value of the speed switching unit 23*a* is largest, in other words, a state where a turn-on speed of the semiconductor switching element 30H is lowest.

Thirteenth Embodiment

Figure 24:
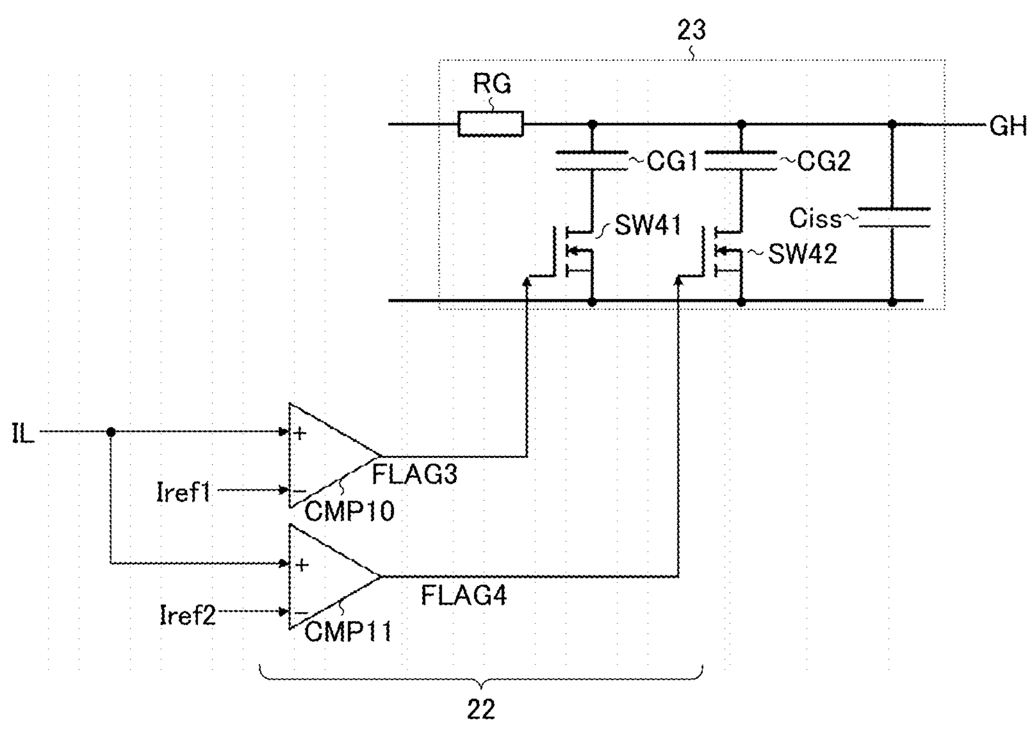
FIG. 24 is a view showing a thirteenth embodiment of the power converter.

FIG. 24 is a view showing a thirteenth embodiment of the power converter 1. The power converter 1 of the present embodiment will be described by showing respective exemplary internal configurations of the speed control unit 22 and the speed switching unit 23 in detail.

The speed control unit 22 includes comparators CMP10 and CMP11.

The comparator CMP10 makes a comparison between the output current IL (or a signal containing information relating thereto) input to a non-inverting input terminal (+) and the reference current Iref1 (or a signal containing information relating thereto) input to an inverting input terminal (−), thereby generating a flag signal FLAG3. As an example, the flag signal FLAG3 is at a low level if the output current IL is smaller than the reference current Iref1, and at a high level if the output current IL is larger than the reference current Iref1.

The comparator CMP11 makes a comparison between the output current IL (or a signal containing information relating thereto) input to a non-inverting input terminal (+) and the reference current Iref2 (or a signal containing information relating thereto) input to an inverting input terminal (−), thereby generating a flag signal FLAG4. As an example, the flag signal FLAG4 is at a low level if the output current IL is smaller than the reference current Iref2, and at a high level if the output current IL is larger than the reference current Iref2.

The reference currents Iref1 and Iref2 may be defined as: Iref1<Iref2.

The output current IL in the speed control unit 22 is detectable by employing any of the means according to the fourth to seventh embodiments (FIG. 7, FIG. 10, FIG. 12, and FIG. 14) described previously.

The speed switching unit 23 includes a gate resistor RG, gate capacitors CG1 and CG2 (=corresponding to a plurality of impedance elements), and switches SW41 and SW42. For example, respective capacitance values of the gate capacitors CG1 and CG2 may be defined as: CG1≤CG2.

A first terminal of the gate resistor RG is connected to the first output terminal of the gate driving unit 21 (=the source of the transistor 21*a* in FIG. 3 described previously). A second terminal of the gate resistor RG and respective first terminals of the gate capacitors CG1 and CG2 are all connected to the application terminal for the gate signal GH (=the gate of the semiconductor switching element 30H). A second terminal of the gate capacitor CG1 is connected to a first terminal of the switch SW41. A second terminal of the gate capacitor CG2 is connected to a first terminal of the switch SW42. Respective second terminals of the switches SW41 and SW42 are both connected to a common node (=the source of the semiconductor switching element 30H).

The switch SW41 is turned on and off in response to the flag signal FLAG3. If an N-channel MOSFET is employed as the switch SW41, for example, the switch SW41 is in an on state if the flag signal FLAG3 is at a high level, and in an off state if the flag signal FLAG3 is at a low level.

The switch SW42 is turned on and off in response to the flag signal FLAG4. If an N-channel MOSFET is employed as the switch SW42, for example, the switch SW42 is in an on state if the flag signal FLAG4 is at a high level, and in an off state if the flag signal FLAG4 is at a low level.

The speed switching unit 23 of this exemplary configuration controls the switches SW41 and SW42 to switch the number of parallel connections of the gate capacitors CG1 and CG2, thereby switching a gate capacitance value (=a combined capacitance value of the gate capacitors CG1 and CG2) to contribute to each of a turn-on speed and a turn-off speed of the semiconductor switching element 30H.

Figure 25:
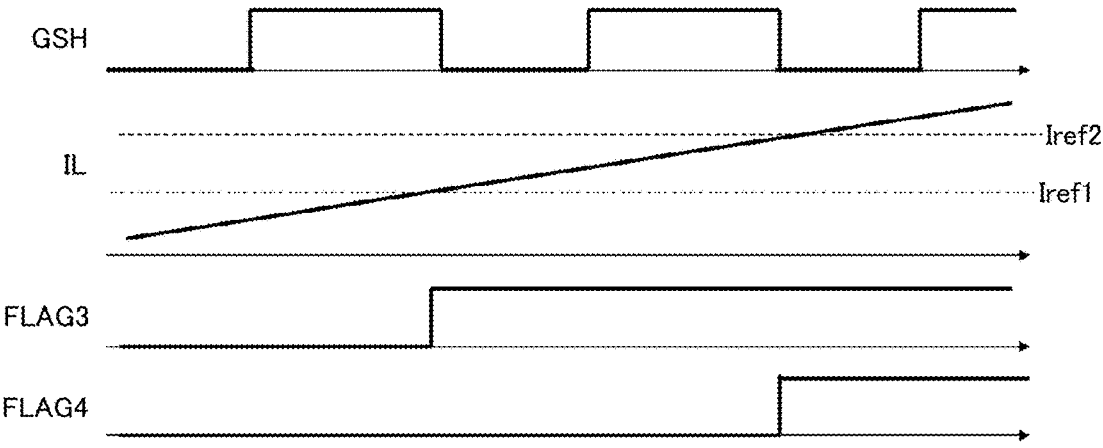
FIG. 25 is a view showing an example of speed switching control according to the thirteenth embodiment.

FIG. 25 is a view showing an example of speed switching control according to the thirteenth embodiment, and shows the control signal GSH, the output current IL, and the flag signals FLAG3 and FLAG4 drawn in this order from the top.

Described first is a case where IL<Iref1. In this case, both the flag signals FLAG3 and FLAG4 are at low levels.

As a result, both the switches SW41 and SW42 are put into off states, so that a gate capacitance value (=a combined capacitance value) of the speed switching unit 23 is set to Ciss. This state corresponds to a state where the gate capacitance value of the speed switching unit 23 is smallest, in other words, a state where a time constant $\tau$(=RG×Ciss) during charging of the input capacitance Ciss is smallest and a turn-on speed and a turn-off speed of the semiconductor switching element 30H are highest.

Described next is a case where Iref1<IL<Iref2. In this case, the flag signal FLAG3 is at a high level and the flag signal FLAG4 is at a low level.

As a result, the switch SW41 is put into an on state and the switch SW42 is put into an off state, so that a gate capacitance value (=a combined capacitance value) of the speed switching unit 23 is set to Ciss+CG1. This state corresponds to a state where the gate capacitance value of the speed switching unit 23 is increased by one step, in other words, a state where the time constant $\tau$(=RG×(Ciss+CG1)) during charging of the input capacitance Ciss is increased by one step and a turn-on speed and a turn-off speed of the semiconductor switching element 30H are each reduced by one step.

Described next is a case where Iref2<IL. In this case, both the flag signals FLAG3 and FLAG4 are at high levels.

As a result, both the switches SW41 and SW42 are put into on states, so that a gate capacitance value (=a combined capacitance value) of the speed switching unit 23 is set to Ciss+CG1+CG2. This state corresponds to a state where the gate capacitance value of the speed switching unit 23 is largest, in other words, a state where the time constant $\tau$(=RG×(Ciss+CG1+CG2)) during charging of the input capacitance Ciss is largest and a turn-on speed and a turn-off speed of the semiconductor switching element 30H are lowest.

Fourteenth Embodiment

Figure 26:
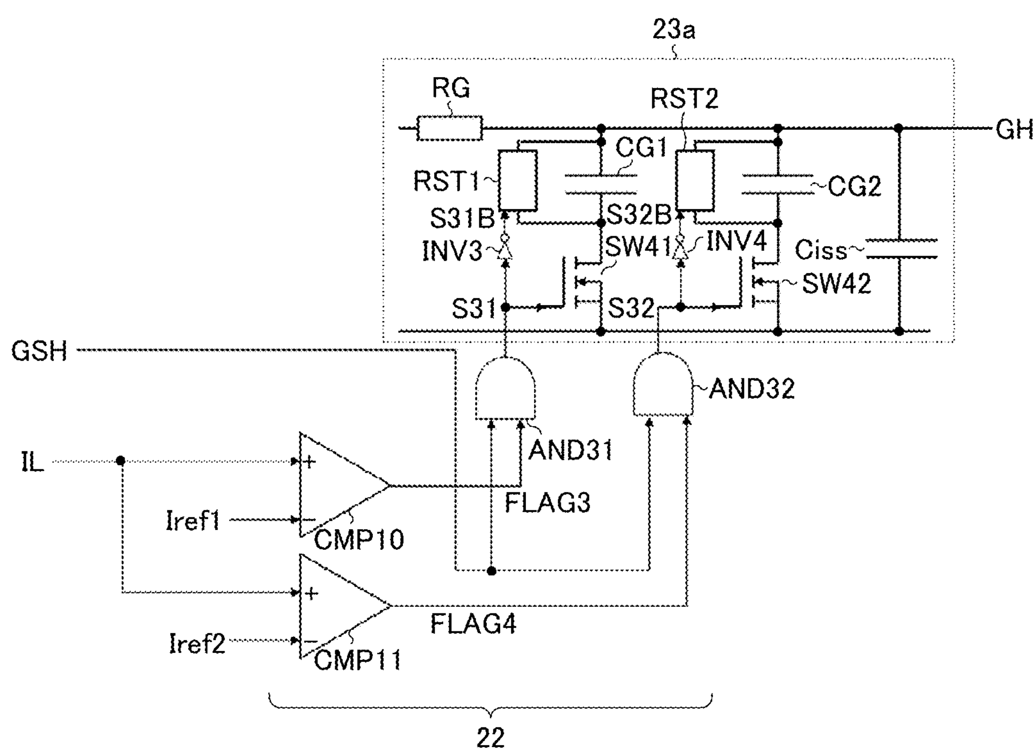
FIG. 26 is a view showing a fourteenth embodiment of the power converter.

FIG. 26 is a view showing a fourteenth embodiment of the power converter 1. While the power converter 1 of the present embodiment is based on the thirteenth embodiment (FIG. 24) described previously, the speed switching unit 23 used as switching means for both a turn-on speed and a turn-off speed is changed to the speed switching unit 23*a* used as switching means for a turn-on speed.

In response to this change, changes are also made to the internal configurations of the speed control unit 22 and the speed switching unit 23*a*. While the speed switching unit 23*b* is not drawn explicitly in this drawing, a circuit configuration of the speed switching unit 23*b* can basically be the same as that of the speed switching unit 23*a*. Thus, in the following, the speed switching unit 23*a* will be described in detail and description of the speed switching unit 23*b* will be omitted.

The speed control unit 22 includes AND gates AND31 and AND32 in addition to the comparators CMP10 and CMP11 described previously.

The AND gate AND31 performs AND operation between the control signal GSH and the flag signal FLAG3 to generate a switching signal S31. Thus, the switching signal S31 is at a low level if at least one of the control signal GSH and the flag signal FLAG3 is at a low level, and at a high level if both the control signal GSH and the flag signal FLAG3 are at high levels. The switching signal S31 is output instead of the flag signal FLAG3 described previously to a control terminal (gate) of the switch SW41.

The AND gate AND32 performs AND operation between the control signal GSH and the flag signal FLAG4 to generate a switching signal S32. Thus, the switching signal S32 is at a low level if at least one of the control signal GSH and the flag signal FLAG4 is at a low level, and at a high level if both the control signal GSH and the flag signal FLAG4 are at high levels. The switching signal S32 is output instead of the flag signal FLAG4 described previously to control terminal (gate) of the switch SW42.

The speed switching unit 23*a* includes inverters INV3 and INV4 and reset circuits RST1 and RST2 in addition to the gate resistor RG, the gate capacitors CG1 and CG2, and the switches SW41 and SW42 described previously.

The switch SW41 is turned on and off in response to the switching signal S31. If an N-channel MOSFET is employed as the switch SW41, for example, the switch SW41 is in an on state if the switching signal S31 at a high level, and in an off state if the switching signal S31 is at a low level.

The switch SW42 is turned on and off in response to the switching signal S32. If an N-channel MOSFET is employed as the switch SW42, for example, the switch SW42 is in an on state if the switching signal S32 at a high level, and in an off state if the switching signal S32 is at a low level.

The inverter INV3 inverts a logic level of the switching signal S31 to generate an inverted switching signal S31B. Thus, the inverted switching signal S31B is at a low level if the switching signal S31 is at a high level, and at a high level if the switching signal S31 is at a low level.

The inverter INV4 inverts a logic level of the switching signal S32 to generate an inverted switching signal S32B. Thus, the inverted switching signal S32B is at a low level if the switching signal S32 is at a high level, and at a high level if the switching signal S32 is at a low level.

The reset circuit RST1 is connected in parallel with the gate capacitor CG1, and resets (discharges) electric charge accumulated in the gate capacitor CG1 in response to the inverted switching signal S31B. By referring to this drawing, the reset circuit RST1 resets (discharges) the electric charge accumulated in the gate capacitor CG1 if the inverted switching signal S31B is at a high level.

The reset circuit RST2 is connected in parallel with the gate capacitor CG2, and resets (discharges) electric charge accumulated in the gate capacitor CG2 in response to the inverted switching signal S32B. By referring to this drawing, the reset circuit RST2 resets (discharges) the electric charge accumulated in the gate capacitor CG2 if the inverted switching signal S32B is at a high level.

The speed switching unit 23*a* of this exemplary configuration controls the switches SW41 and SW42 to switch the number of parallel connections of the gate capacitors CG1 and CG2, thereby switching a gate capacitance value (=a combined capacitance value of the gate capacitors CG1 and CG2) to contribute to a turn-on speed of the semiconductor switching element 30H.

Figure 27:
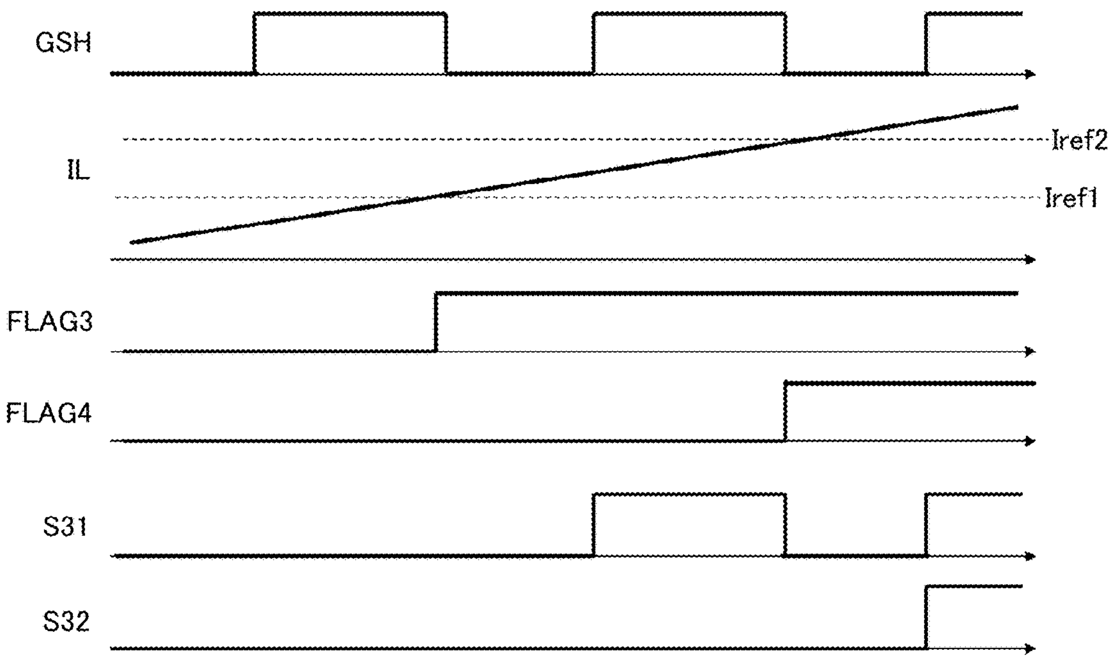
FIG. 27 is a view showing an example of speed switching control according to the fourteenth embodiment.

FIG. 27 is a view showing an example of speed switching control according to the fourteenth embodiment, and shows the control signal GSH, the output current IL, the flag signals FLAG3 and FLAG4, and the switching signals S31 and S32 drawn in this order from the top.

Described first is a case where IL<Iref1. In this case, both the flag signals FLAG3 and FLAG4 are at low levels.

Thus, during a high-level period of the control signal GSH (=corresponding to an on period of the semiconductor switching element 30H), both the switching signals S31 and S32 are at low levels. As a result, both the switches SW41 and SW42 are put into off states, so that a gate capacitance value (=a combined capacitance value) of the speed switching unit 23*a* is set to Ciss. This state corresponds to a state where the gate capacitance value of the speed switching unit 23*a* is smallest, in other words, a state where the time constant τ(=RG×Ciss) during charging of the input capacitance Ciss is smallest and a turn-on speed of the semiconductor switching element 30H is highest.

Described next is a case where Iref1<IL<Iref2. In this case, the flag signal FLAG3 is at a high level and the flag signal FLAG4 is at a low level.

Thus, during a high-level period of the control signal GSH (=corresponding to an on period of the semiconductor switching element 30H), the switching signal S31 is at a high level and the switching signal S32 is at a low level. As a result, the switch SW41 is put into an on state and the switch SW42 is put into an off state, so that a gate capacitance value (=a combined capacitance value) of the speed switching unit 23*a* is set to Ciss+CG1. This state corresponds to a state where the gate capacitance value of the speed switching unit 23*a* is increased by one step, in other words, a state where the time constant τ(=RG×(Ciss+CG1)) during charging of the input capacitance Ciss is increased by one step and a turn-on speed of the semiconductor switching element 30H is reduced by one step.

Described next is a case where Iref2<IL. In this case, both the flag signals FLAG3 and FLAG4 are at high levels.

Thus, during a high-level period of the control signal GSH (=corresponding to an on period of the semiconductor switching element 30H), both the switching signals S31 and S32 are at high levels. As a result, both the switches SW41 and SW42 are put into on states, so that a gate capacitance value (=a combined capacitance value) of the speed switching unit 23*a* is set to Ciss+CG1+CG2. This state corresponds to a state where the gate capacitance value of the speed switching unit 23*a* is largest, in other words, a state where the time constant τ(=RG×(Ciss+CG1+CG2)) during charging of the input capacitance Ciss is largest and a turn-on speed of the semiconductor switching element 30H is lowest.

During a low-level period of the control signal GSH (=corresponding to an off period of the semiconductor switching element 30H), both the switching signals S31 and S32 are at low levels. At this time, both the inverted switching signals S31B and S32B are at high levels, so that electric charge accumulated in each of the gate capacitors CG1 and CG2 is reset (discharged). This makes it possible to start charging of the gate capacitors CG1 and CG2 newly during an on period of the semiconductor switching element 30H in a next cycle, thereby preventing hindrance to switching control over a turn-on speed.

The present embodiment is applied effectively if there is an intention to provide the speed switching unit 23*a* for switching control over a turn-on speed and the speed switching unit 23*b* for switching control over a turn-off speed separately or if there is an intention to control switching of only one of a turn-on speed and a turn-off speed.

Figure 28:
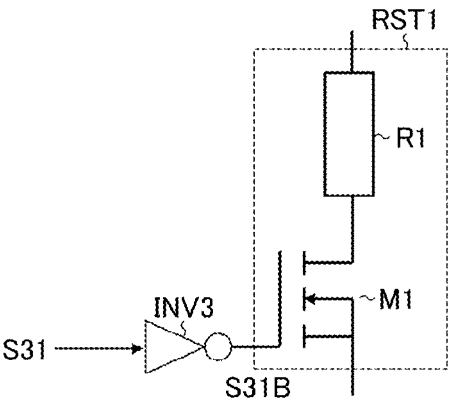
FIG. 28 is a view showing an exemplary configuration of a reset circuit.

FIG. 28 is a view showing an exemplary configuration of the reset circuit RST1. A circuit configuration of the reset circuit RST2 can basically be the same as that of the reset circuit RST1. Thus, in the following, the reset circuit RST1 will be described in detail and description of the reset circuit RST2 will be omitted.

The reset circuit RST1 of this exemplary configuration includes a resistor R1 and a transistor M1 (an NMOSFET, for example). A first terminal of the resistor R1 is connected to the first terminal of the gate capacitor CG1 (see FIG. 26). A second terminal of the resistor R1 is connected to a drain of the transistor M1. A source of the transistor M1 is connected to the second terminal of the gate capacitor CG1. A gate of the transistor M1 is connected to an output terminal of the inverter INV3 (=an application terminal for the inverted switching signal S31B).

The transistor M1 is in an on state if the inverted switching signal S31B is at a high level, and in an off state if the inverted switching signal S31B is at a low level. When the transistor M1 is in an on state, a short-circuit is placed across the gate capacitor CG1 through the resistor R1 and the transistor M1. As a result, electric charge accumulated in the gate capacitor CG1 is reset (discharged).

Overview

The embodiments given above will be described as a whole.

As an example, the gate driving device disclosed in the present description has a configuration (a first configuration) where the gate driving device comprises: a gate driving unit configured to output power for switching between on and off of a semiconductor switching element; a speed control unit configured to control at least one of a turn-on speed and a turn-off speed of the semiconductor switching element; and a speed switching unit configured to switch at least one of the turn-on speed and the turn-off speed in response to an instruction from the speed control unit. The speed switching unit includes a plurality of impedance elements; and a switch configured to control power output from the gate driving unit and to pass through a corresponding one of the plurality of impedance elements. The speed control unit controls the switch on the basis of an output current flowing in the semiconductor switching element.

The gate driving device according to the first configuration may have a configuration (a second configuration) where the speed switching unit includes at least one of a gate resistor and a gate capacitor as the plurality of impedance elements.

The gate driving device according to the first or second configuration may have a configuration (a third configuration) where the speed switching unit includes: a first speed switching unit configured to switch the turn-on speed; and a second speed switching unit configured to switch the turn-off speed.

The gate driving device according to any of the first to third configurations may have a configuration (a fourth configuration) where the speed control unit includes a sample hold circuit configured to hold a detection value of the output current or a voltage across the semiconductor switching element for a fixed period.

The gate driving device according to any of the first to fourth configurations may have a configuration (a fifth configuration) where the speed control unit includes a current estimation part configured to estimate the output current from a voltage across the semiconductor switching element or from a sense current responsive to the output current.

The gate driving device according to any of the first to third configurations may have a configuration (a sixth configuration) where the speed control unit controls the switch in response to acceptance of a current command value generated by a control device.

The gate driving device according to the sixth configuration may have a configuration (a seventh configuration) where the speed control unit reduces at least one of the turn-on speed and the turn-off speed to a minimum if the output current is larger than a threshold.

The gate driving device according to the third configuration may have a configuration (an eighth configuration) where the gate driving device further comprises: a first diode configured to have an anode connected to an output terminal of the first speed switching unit and a cathode connected to a gate of the semiconductor switching element; and a second diode configured to have a cathode connected to an output terminal of the second speed switching unit and an anode connected to the gate of the semiconductor switching element.

The gate driving device according to any of the first to eighth configurations may have a configuration (a ninth configuration) where the speed switching unit switches a gate resistance value or a gate capacitance value of the semiconductor switching element.

As an example, the power converter disclosed in the present description has a configuration (a tenth configuration) where the power converter comprises: the gate driving device according to any of the first to ninth configurations; a control device configured to control the gate driving device; and a semiconductor switching element configured to be turned on and off by the gate driving device.

According to the present disclosure, it is possible to provide a gate driving device of low switching loss and a power converter using the gate driving device.

Other Modifications

The various technical features disclosed in the present description can be implemented in any other manner than in the embodiments described above and allow for many modifications within a range not departing from the spirit of the technical creations thereof. Specifically, the above embodiments should be understood to be in every aspect illustrative and not restrictive. The technical scope of the present disclosure is defined by the appended claims and should be understood to encompass any modifications belonging to a sense and scope equivalent to those of the claims.

What is claimed is:

1. A gate driving device comprising:

a gate driving unit configured to output power for switching between on and off of a semiconductor switching element, a speed control unit configured to control at least one of a turn-on speed and a turn-off speed of the semiconductor switching element; and a speed switching unit configured to switch at least one of the turn-on speed and the turn-off speed in response to an instruction from the speed control unit, wherein the speed switching unit includes:

a plurality of impedance elements; and a switch configured to control power output from the gate driving unit and to pass through a corresponding one of the plurality of impedance elements, and the speed control unit controls the switch on the basis of an output current flowing in the semiconductor switching element, wherein the speed control unit includes a sample hold circuit configured to hold a detection value of the output current or a voltage across the semiconductor switching element for a fixed period.

2. The gate driving device according to claim 1, wherein the speed switching unit includes at least one of a gate resistor and a gate capacitor as the plurality of impedance elements.

3. The gate driving device according to claim 1, wherein the speed switching unit includes:

a first speed switching unit configured to switch the turn-on speed; and a second speed switching unit configured to switch the turn-off speed.

4. The gate driving device according to claim 3, further comprising:

a first diode configured to have an anode connected to an output terminal of the first speed switching unit and a cathode connected to a gate of the semiconductor switching element; and a second diode configured to have a cathode connected to an output terminal of the second speed switching unit and an anode connected to the gate of the semiconductor switching element.

5. The gate driving device according to claim 1, wherein the speed control unit includes a current estimation part configured to estimate the output current from a voltage across the semiconductor switching element or from a sense current responsive to the output current.

6. The gate driving device according to claim 1, wherein the speed control unit controls the switch in response to acceptance of a current command value generated by a control device.

7. The gate driving device according to claim 6, wherein the speed control unit reduces at least one of the turn-on speed and the turn-off speed to a minimum if the output current is larger than a threshold.

8. The gate driving device according to claim 1, wherein the speed switching unit switches a gate resistance value or a gate capacitance value of the semiconductor switching element.

9. A power converter comprising:

the gate driving device according to claim 1;

a control device configured to control the gate driving device; and a semiconductor switching element configured to be turned on and off by the gate driving device.

10. A gate driving device comprising:

a gate driving unit configured to output power for switching between on and off of a semiconductor switching element, a speed control unit configured to control at least one of a turn-on speed and a turn-off speed of the semiconductor switching element; and a speed switching unit configured to switch at least one of the turn-on speed and the turn-off speed in response to an instruction from the speed control unit, wherein the speed switching unit includes:

a plurality of impedance elements; and a switch configured to control power output from the gate driving unit and to pass through a corresponding one of the plurality of impedance elements, and the speed control unit controls the switch on the basis of an output current flowing in the semiconductor switching element, wherein the speed switching unit includes:

a first speed switching unit configured to switch the turn-on speed; and a second speed switching unit configured to switch the turn-off speed, and the gate driving device further comprises:

a first diode configured to have an anode connected to an output terminal of the first speed switching unit and a cathode connected to a gate of the semiconductor switching element; and a second diode configured to have a cathode connected to an output terminal of the second speed switching unit and an anode connected to the gate of the semiconductor switching element.

* * * * *